United States Patent
Bukhari et al.

(10) Patent No.: US 12,230,332 B2
(45) Date of Patent: Feb. 18, 2025

(54) SUSPENDING MEMORY ERASE OPERATIONS TO PERFORM HIGHER PRIORITY MEMORY COMMANDS

(71) Applicant: Micron Technology, Inc., Boise, ID (US)

(72) Inventors: Shakeel Isamohiuddin Bukhari, San Jose, CA (US); Mark Ish, Manassas, VA (US)

(73) Assignee: Micron Technology, Inc., Boise, ID (US)

( * ) Notice: Subject to any disclaimer, the term of this patent is extended or adjusted under 35 U.S.C. 154(b) by 189 days.

(21) Appl. No.: 17/931,935

(22) Filed: Sep. 14, 2022

(65) Prior Publication Data

US 2024/0071520 A1 Feb. 29, 2024

Related U.S. Application Data

(60) Provisional application No. 63/374,095, filed on Aug. 31, 2022.

(51) Int. Cl.
*G11C 16/26* (2006.01)
*G11C 16/16* (2006.01)
*G11C 16/32* (2006.01)

(52) U.S. Cl.
CPC .............. *G11C 16/26* (2013.01); *G11C 16/16* (2013.01); *G11C 16/32* (2013.01)

(58) Field of Classification Search
CPC .................................................... G11C 16/16
See application file for complete search history.

(56) References Cited

U.S. PATENT DOCUMENTS

| | | | | |
|---|---|---|---|---|
| 9,443,599 | B2* | 9/2016 | Yi | G06F 13/161 |
| 10,643,711 | B1* | 5/2020 | Yuan | G11C 16/32 |
| 10,998,056 | B1* | 5/2021 | Shin | G11C 16/0483 |
| 11,790,997 | B2* | 10/2023 | Kamata | G11C 16/26 365/244 |
| 2010/0238730 | A1* | 9/2010 | Dutta | G11C 11/5635 365/185.17 |
| 2012/0179860 | A1* | 7/2012 | Falanga | G11C 16/102 711/155 |
| 2012/0254515 | A1* | 10/2012 | Melik-Martirosian | G06F 12/0246 711/E12.008 |
| 2013/0198451 | A1* | 8/2013 | Hyun | G06F 3/0652 711/155 |
| 2014/0047167 | A1* | 2/2014 | Kwak | G06F 12/0246 711/102 |
| 2014/0215175 | A1* | 7/2014 | Kasorla | G06F 13/24 711/167 |

(Continued)

*Primary Examiner* — Douglas King
(74) *Attorney, Agent, or Firm* — Harrity & Harrity, LLP

(57) ABSTRACT

Implementations described herein relate to suspending memory erase operations to perform high priority memory commands. In some implementations, a memory device may detect, while an active stage of an erase operation is being performed by the memory device, a pending memory command with a higher priority than the erase operation. The memory device may selectively suspend the active stage of the erase operation, to allow the pending memory command to be executed, based on the active stage of the erase operation that is being performed and/or a value of a suspend determination timer associated with suspending the active stage of the erase operation.

25 Claims, 13 Drawing Sheets

(56) References Cited

U.S. PATENT DOCUMENTS

| | | | |
|---|---|---|---|
| 2015/0221381 A1* | 8/2015 | Nam | G11C 16/3445 |
| | | | 365/185.12 |
| 2016/0379715 A1* | 12/2016 | Pelster | G11C 16/16 |
| | | | 365/185.11 |
| 2017/0069372 A1* | 3/2017 | Kodama | G11C 16/14 |
| 2018/0024772 A1* | 1/2018 | Madraswala | G06F 3/0679 |
| | | | 711/103 |
| 2019/0080773 A1* | 3/2019 | Kondo | G11C 16/08 |
| 2020/0135284 A1* | 4/2020 | Dayacap | G11C 16/32 |
| 2021/0042037 A1* | 2/2021 | Cariello | G06F 3/0652 |
| 2023/0393784 A1* | 12/2023 | Makhija | G06F 3/0659 |

* cited by examiner

| Memory Operation / Command | Priority Level |
|---|---|
| Host Read (multi-plane or single plane) | P3 (High Priority) |
| Write (Host, GC, FTL, FSA, RAIN) | P2 |
| Erase | P2 |
| GC Read | P1 |
| Other Internal Read (Scan, FTL, FSA) | P0 (Low Priority) |
| Other (non-read, non-write, non-erase) | P0 (Low Priority) |

FIG. 5

SUSPENDING MEMORY ERASE OPERATIONS TO PERFORM HIGHER PRIORITY MEMORY COMMANDS

CROSS-REFERENCE TO RELATED APPLICATION

This Patent Applications claims priority to U.S. Provisional Patent Application No. 63/374,095, filed on Aug. 31, 2022, and entitled "SUSPENDING MEMORY ERASE OPERATIONS TO PERFORM HIGHER PRIORITY MEMORY COMMANDS." The disclosure of the prior Applications is considered part of and is incorporated by reference into this Patent Applications.

TECHNICAL FIELD

The present disclosure generally relates to memory devices, memory device operations, and, for example, to suspending memory erase operations to perform high priority memory commands.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, the electronic device may write to, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), holographic RAM (HRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source.

BRIEF DESCRIPTION OF THE DRAWINGS

FIG. 5 is a diagram of an example prioritization of memory operations.

DETAILED DESCRIPTION

Figure 1:
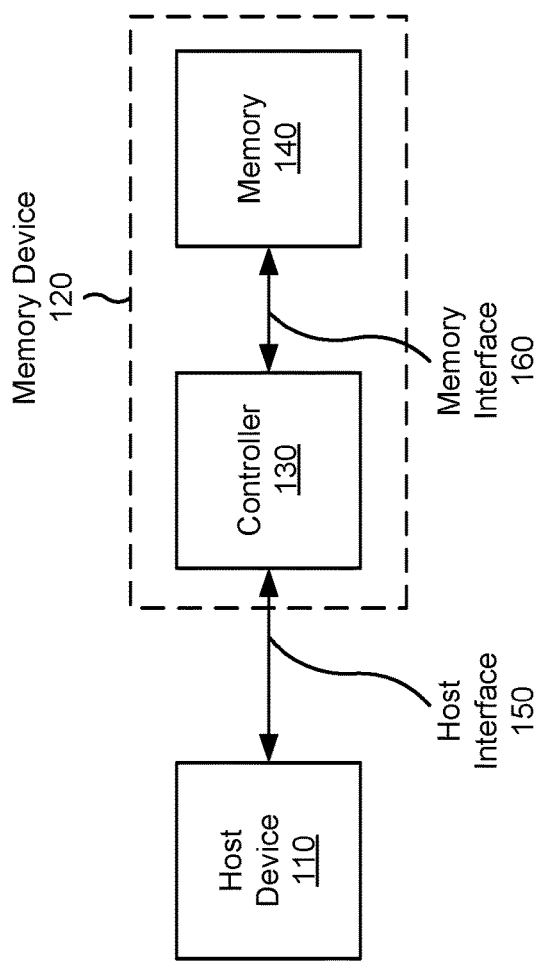
FIG. 1 is a diagram illustrating an example system capable of suspending memory erase operations to perform high priority memory commands.

Various memory operations may be performed by a memory device, such as a read operation to read data from memory, a write operation (sometimes called a program operation) to write (or program) data to memory, and an erase operation to erase data previously stored in memory. Some memory devices may be associated with requirements, such as a requirement to execute a read command (e.g., received from a host device) within a threshold amount of time of receiving the read command to achieve a particular performance level. For example, a memory device may have a requirement to execute a host read command within one millisecond of the host read command being received.

This requirement may be difficult to satisfy, particularly if another memory operation is being performed when the read command is received from the host device. For example, an erase operation may take four milliseconds or longer to be performed. In some cases, the erase operation may be suspended after execution of a stage of the erase operation, such as an erase preparation stage, an erase pulse stage, an erase verify stage, or an erase completion stage (described in more detail below). This can be effective for a stage that is shorter than the requirement (e.g., a stage that is less than one millisecond or that is less than 0.5 milliseconds), such that suspending the erase operation after the stage leaves sufficient time to perform the read operation to satisfy the requirement. However, for a stage that is longer than the requirement (e.g., a stage that is longer than one millisecond), waiting to suspend the erase operation until after the stage is performed can result in the requirement not being satisfied (e.g., if a read command is received shortly after the stage begins).

One way to address this issue is to suspend the erase operation in the middle of a stage. However, this may lead to little or no progress being made for that stage, particularly if the stage requires ramping of a voltage to a target voltage (e.g., to an erase voltage) and application of the target voltage to memory cells to change a data state of those memory cells (e.g., in an erase pulse stage). If read commands are repeatedly received during a stage of an erase operation, causing suspension of the stage, then memory cells that are scheduled for erasure may be unusable for a long period of time, which negatively impacts resource utilization. Furthermore, repeated ramping and application of a target voltage to memory cells during a stage of an erase operation, without completing that stage (e.g., due to repeated suspensions caused by read commands), may degrade memory cells, lead to excess power consumption, reduce a lifespan of the memory device, and/or increase latency of the erase operation and other operations to be performed after the erase operation.

Some implementations described herein enable a stage of an erase operation to be suspended to perform a higher priority memory command, such as a memory command (e.g., a host read command) associated with a requirement, while also ensuring that progress is made for that stage. For example, the stage may be suspended at a point in time when a target voltage has been applied to memory cells for some period of time, such that when the stage is resumed, the entire stage does not need to be performed again. This may reduce the amount of time required to perform the erase operation, which may lead to less degradation of memory cells due to the erase operation, may result in less power consumption, may extend a lifespan of the memory device, and/or may reduce latency associated with performing other memory operations.

FIG. 1 is a diagram illustrating an example system 100 capable of suspending memory erase operations to perform high priority memory commands. The system 100 may include one or more devices, apparatuses, and/or components for performing operations described herein. For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, a device in a data center, a device in a cloud computing environment, a vehicle (e.g., an automobile or an airplane), and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

The memory device 120 may be any electronic device configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device. In this case, the memory 140 may include non-volatile memory configured to maintain stored data after the memory device 120 is powered off. For example, the memory 140 may include NAND memory or NOR memory. In some implementations, the memory 140 may include volatile memory that requires power to maintain stored data and that loses stored data after the memory device 120 is powered off, such as one or more latches and/or random-access memory (RAM), such as dynamic RAM (DRAM) and/or static RAM (SRAM). For example, the volatile memory may cache data read from or to be written to non-volatile memory, and/or may cache instructions to be executed by the controller 130.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include a memory controller, a system controller, an ASIC, an FPGA, a processor, a microcontroller, and/or one or more processing components. In some implementations, the controller 130 may be a high-level controller, which may communicate directly with the host device 110 and may instruct one or more low-level controllers regarding memory operations to be performed in connection with the memory 140. In some implementations, the controller 130 may be a low-level controller, which may receive instructions regarding memory operations from a high-level controller that interfaces directly with the host device 110. As an example, a high-level controller may be an SSD controller, and a low-level controller may be a non-volatile memory controller (e.g., a NAND controller) or a volatile memory controller (e.g., a DRAM controller). In some implementations, a set of operations described herein as being performed by the controller 130 may be performed by a single controller (e.g., the entire set of operations may be performed by a single high-level controller or a single low-level controller). Alternatively, a set of operations described herein as being performed by the controller 130 may be performed by more than one controller (e.g., a first subset of the operations may be performed by a high-level controller and a second subset of the operations may be performed by a low-level controller).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

In some implementations, the memory device 120 and/or the controller 130 may be configured to detect, while an active stage of an erase operation is being performed by the memory device 120 and/or the controller 130, a pending memory command with a higher priority than the erase operation. The memory device 120 and/or the controller 130 may be configured to selectively suspend the active stage of the erase operation to allow the pending memory command to be executed. For example, the memory device 120 and/or the controller 130 may be configured to selectively suspend (e.g., suspend or refrain from suspending) the active stage based on the active stage of the erase operation that is being performed and/or a value of a suspend determination timer, associated with suspending the active stage of the erase operation, when the pending memory command is detected.

Additionally, or alternatively, the memory device 120 and/or the controller 130 may be configured to perform an erase operation on memory. The erase operation may include one or more erase pulse stages and one or more erase verify stages, where each erase verify stage follows a corresponding erase pulse stage. The memory device 120 and/or the controller 130 may be configured to detect, while the erase operation is being performed, a pending memory command having a higher priority than the erase operation. The memory device 120 and/or the controller 130 may be configured to suspend the erase operation to enable the pending memory command to be executed. For example, the memory device 120 and/or the controller 130 may be configured to suspend the erase operation based on a first condition if an erase pulse stage of the erase operation is being performed and may be configured to suspend the erase operation based on a second condition if an erase verify stage of the erase operation is being performed.

Additionally, or alternatively, the memory device 120 and/or the controller 130 may be configured to detect a pending host read command during an erase pulse stage of an erase operation that is being performed by the memory device 120 and/or the controller 130. The erase pulse stage may include a voltage ramping period, in which a voltage applied to a plurality of access lines of the memory device increases from a baseline voltage to an erase voltage, and an erase voltage period, that follows the voltage ramping period, in which the erase voltage is applied to the plurality of access lines. The memory device 120 and/or the controller 130 may be configured to determine an elapsed time associated with the erase pulse stage of the erase operation and selectively suspend the erase pulse stage of the erase operation based on detecting the pending host read command and based on whether the elapsed time satisfies a condition.

As indicated above, FIG. 1 is provided as an example. Other examples may differ from what is described with regard to FIG. 1.

Figure 2:
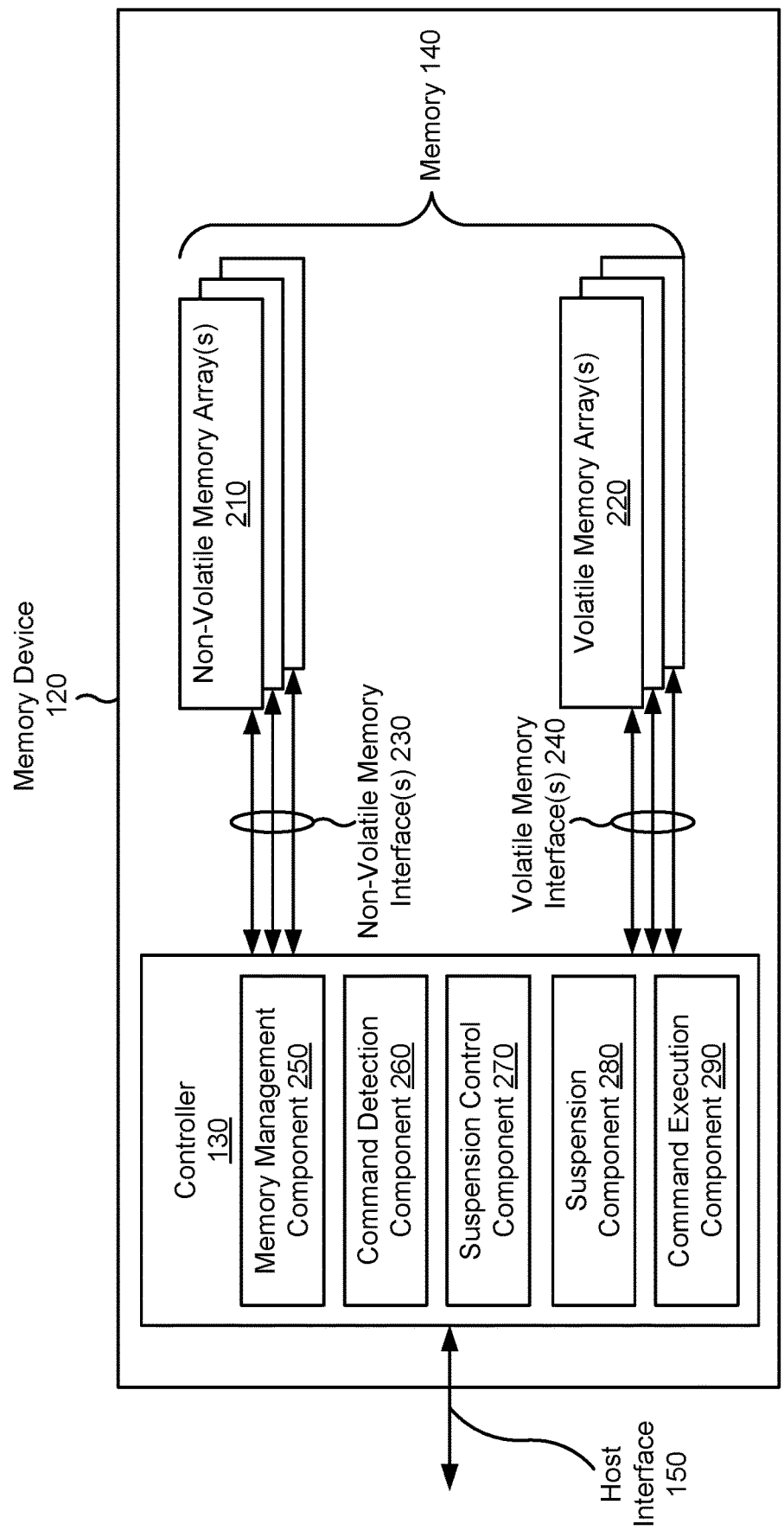
FIGS. 2 and 3 are diagrams of example components included in a memory device.

FIG. 2 is a diagram of example components included in a memory device 120. As described above in connection with FIG. 1, the memory device 120 may include a controller 130 and memory 140. As shown in FIG. 2, the memory 140 may include one or more non-volatile memory arrays 210, such as one or more NAND memory arrays and/or one or more NOR memory arrays. Additionally, or alternatively, the memory 140 may include one or more volatile memory arrays 220, such as one or more SRAM arrays and/or one or more DRAM arrays. The controller 130 may transmit signals to and receive signals from a non-volatile memory array 210 using a non-volatile memory interface 230. The controller 130 may transmit signals to and receive signals from a volatile memory array 220 using a volatile memory interface 240.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface 150, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 250, a command detection component 260, a suspension control component 270, a suspension component 280, and/or a command execution component 290. In some implementations, one or more of these components are implemented as one or more instructions (e.g., firmware) executed by the controller 130. Alternatively, one or more of these components may be implemented as dedicated integrated circuits distinct from the controller 130.

The memory management component 250 may be configured to manage performance of the memory device 120. For example, the memory management component 250 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 250, such as information regarding memory block age, memory block erase count, and/or error information associated with a memory partition (e.g., a memory cell, a row of memory, a block of memory, or the like).

The command detection component 260 may be configured to detect, while an erase operation is being performed, a pending memory command having a higher priority than the erase operation. For example, the command detection component 260 may be configured to detect, while an active stage of the erase operation is being performed, a pending memory command with a higher priority than the erase operation. As a more specific example, the command detection component 260 may be configured to detect a high priority pending memory command during an erase pulse stage of the erase operation. In some implementations, the pending memory command is a host read command, which has a high priority. In some implementations, commands that are received (e.g., from the host device 110) and/or generated (e.g., by the memory device 120) may be stored in a queue, and the command detection component 260 may be configured to monitor the queue for high priority memory commands (e.g., host read commands).

The suspension control component 270 may be configured to control whether the erase operation is suspended (e.g., to enable execution of the pending memory command). For example, the suspension control component 270 may be configured to determine whether to suspend or refrain from suspending the erase operation based on one or more parameters, such as the active stage of the erase operation, a condition associated with the active stage, a value of a suspend determination timer, and/or an elapsed time associated with the active stage. In some implementations, the command detection component 260 may be configured to notify the suspension control component 270 of a pending memory command having a higher priority than the erase operation, and the suspension control component 270 may be configured to determine whether to suspend the erase operation based on the notification. In some implementations, the suspension control component 270 may be configured to control resumption of the erase operation (e.g., after execution of the pending memory command).

The suspension component 280 may be configured to suspend the erase operation (e.g., to enable execution of the pending memory command). For example, the suspension component 280 may be configured to suspend the erase operation based on a suspension indication received from the suspension control component 270, which is based on a determination by the suspension control component 270 of whether to suspend the erase operation. If the suspension component 280 does not receive the suspension indication from the suspension control component 270, then the suspension component 280 does not suspend the erase operation. Thus, the suspension control component 270 and the suspension component 280 together may selectively suspend (e.g., suspend or refrain from suspending) the erase operation (e.g., based on one or more parameters, as described above). In some implementations, the suspension component 280 may be configured to resume the erase operation based on a resumption indication received from the suspension control component 270. In some implementations, the suspension component 280 may be configured to store a progress indicator based on suspending the erase operation. The suspension component 280 may be configured to resume the active stage of the erase operation based on the progress indicator.

The command execution component 290 may be configured to execute one or more memory commands (e.g., a read command, a write command, or an erase command) and/or perform one or more memory operations (e.g., a read operation, a write operation, or an erase operation). For example, the command execution component 290 may be configured to perform an erase operation on memory (e.g., based on executing an erase command), such as the erase operation described in more detail bellow in connection with FIG. 4. Additionally, or alternatively, the command execution component 290 may be configured to perform a high priority memory operation (e.g., by executing a high priority memory command), such as a host read command, while the erase operation is suspended. In some implementations, the command execution component 290 may be configured to resume the suspended erase operation after executing a high priority memory command that triggered suspension of the erase operation. For example, the command execution component 290 may be configured to resume the suspended erase operation based on a stored progress indicator.

Figure 9:
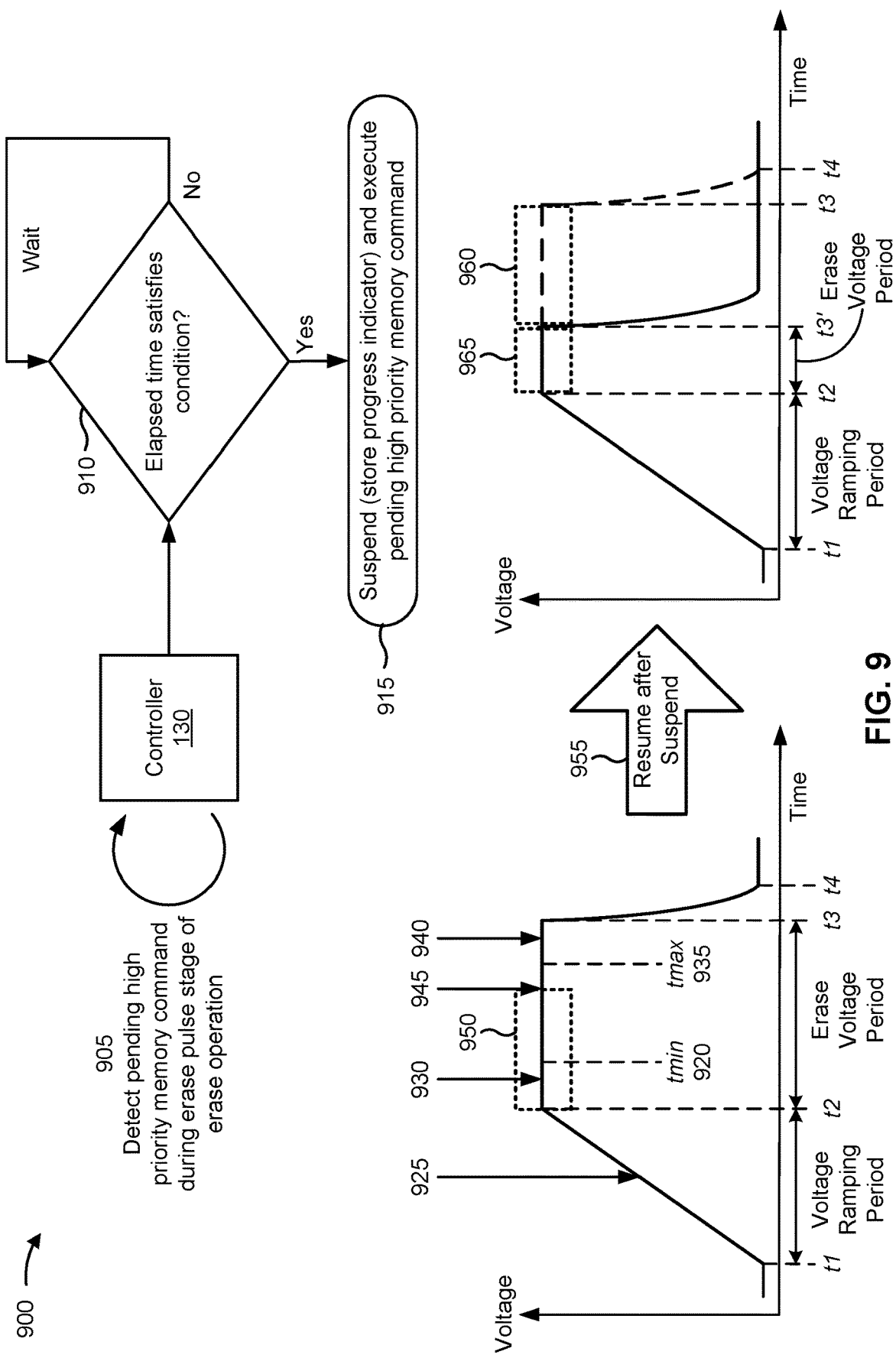
Figure 10:
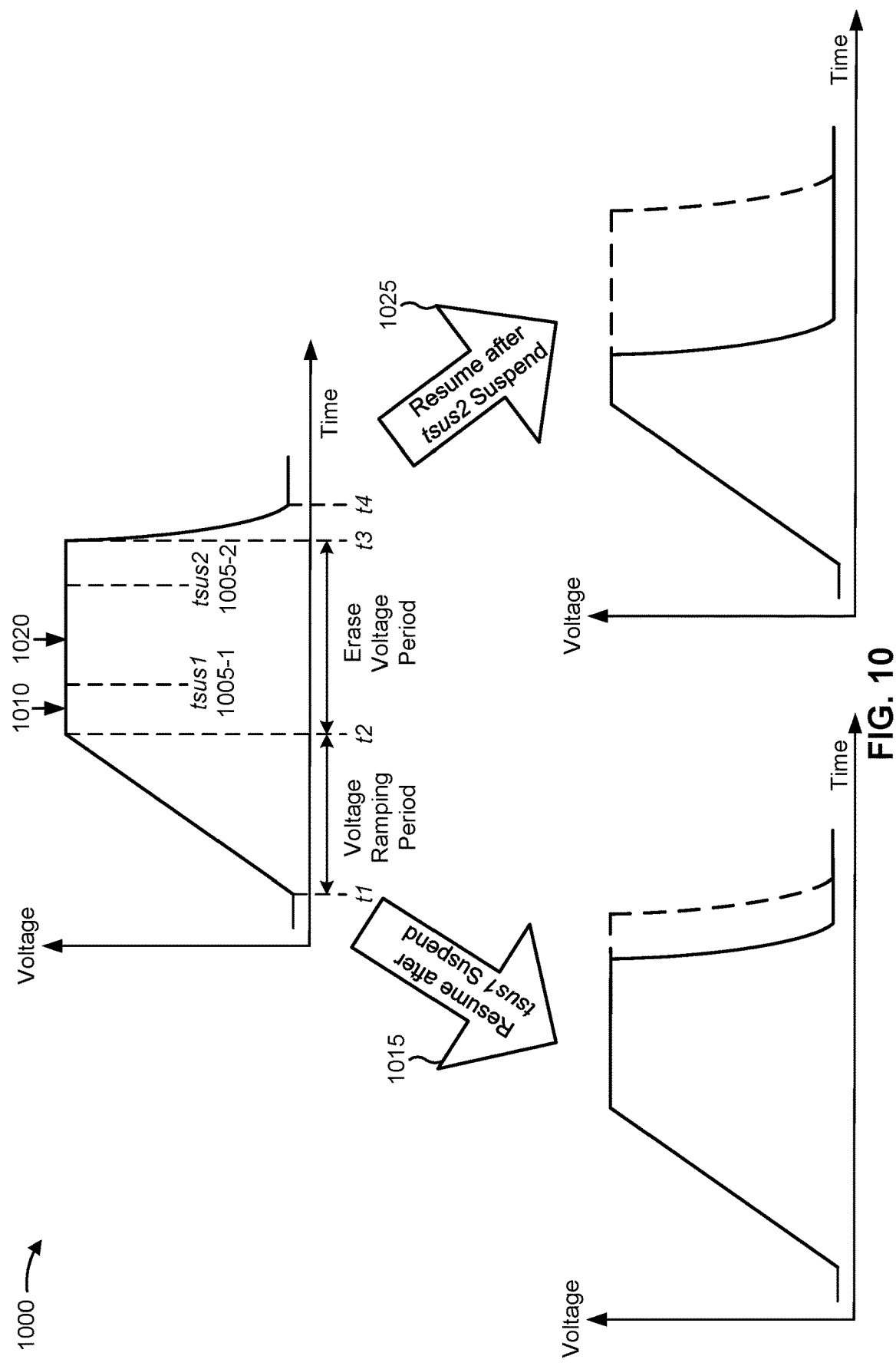
Figure 11:
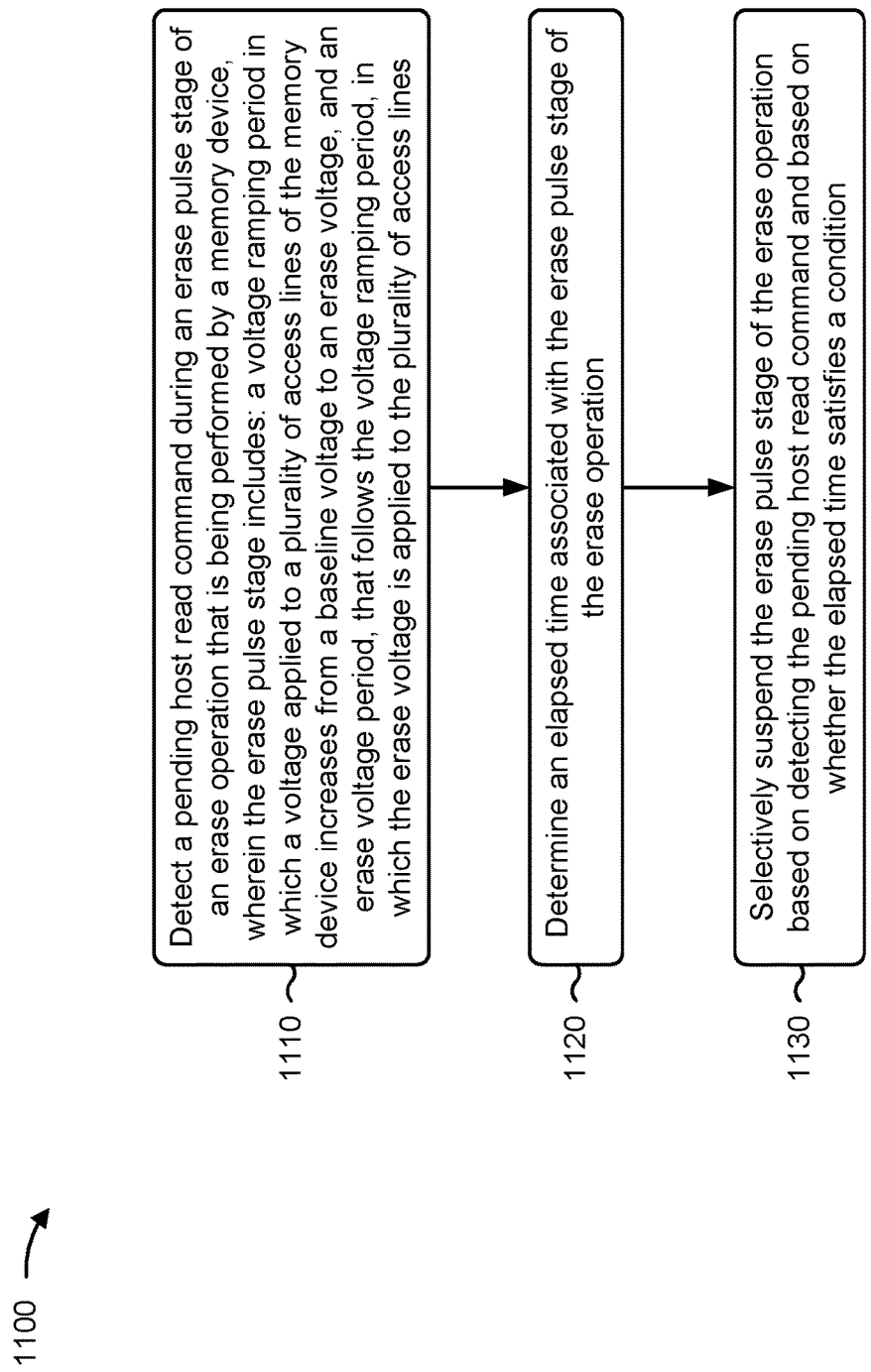
FIGS. 11-13 are flowcharts of example methods associated with suspending memory erase operations to perform higher priority memory commands.
Figure 12:
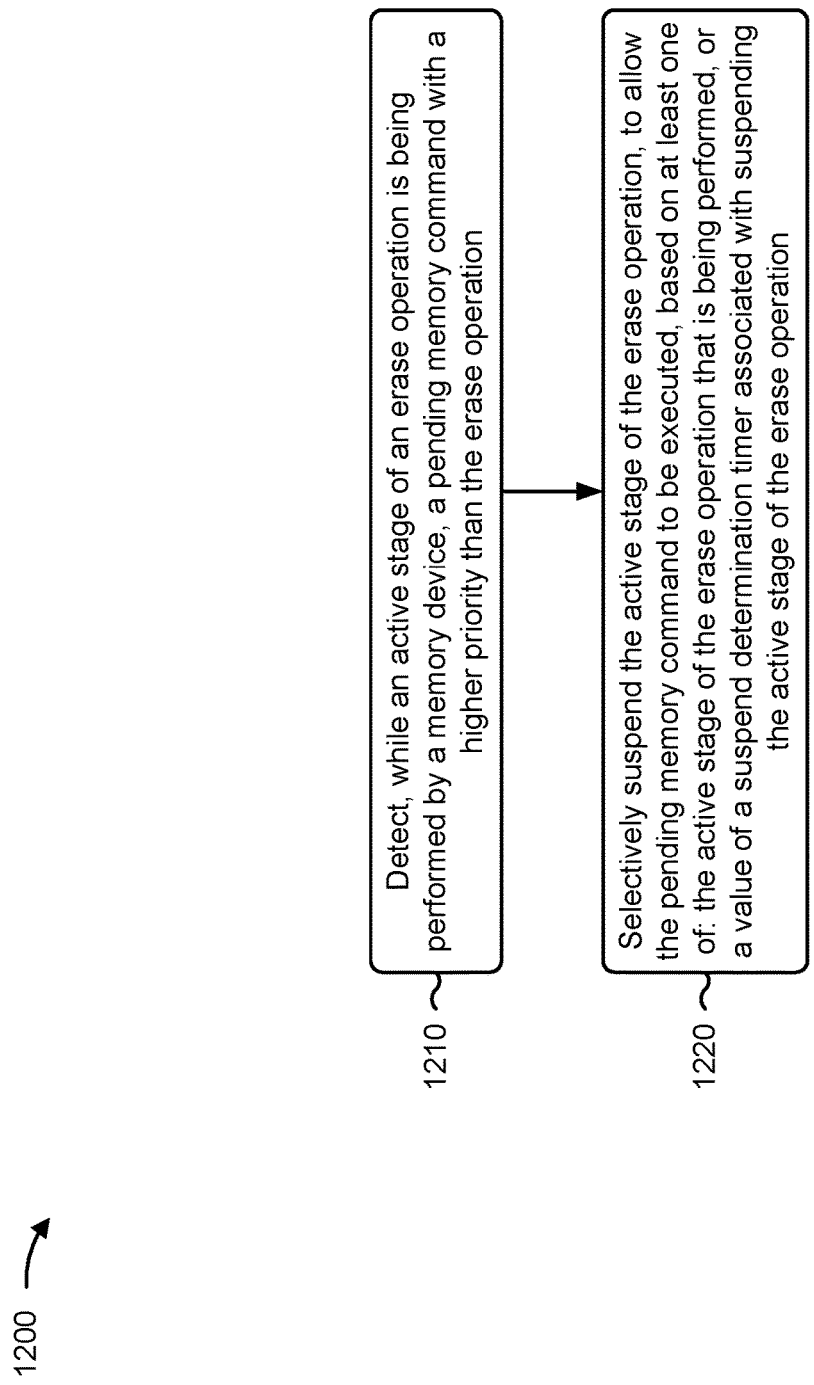
Figure 13:
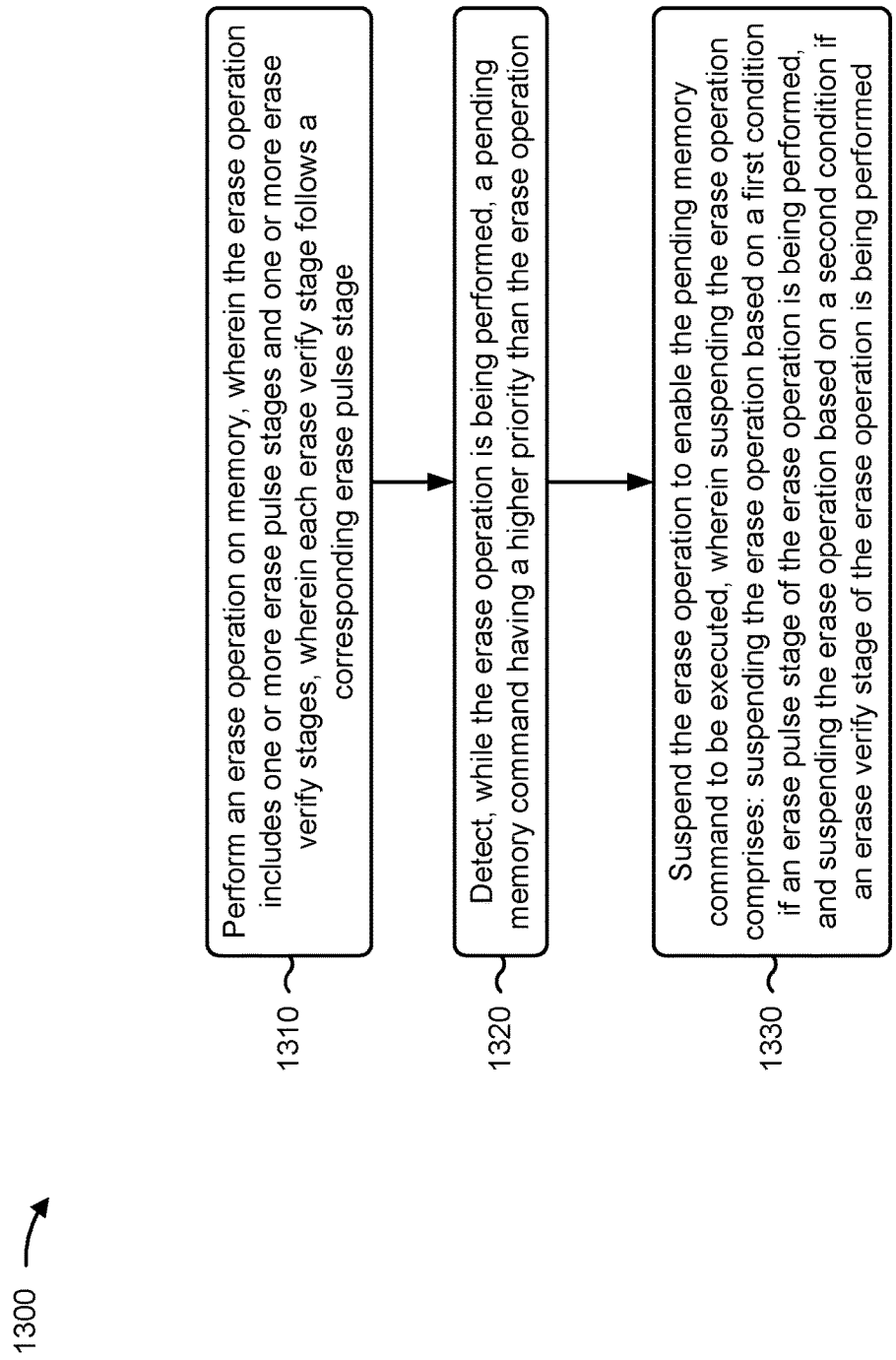

One or more devices or components shown in FIG. 2 may be configured to perform operations described elsewhere herein, such as one or more operations of FIGS. 3-10 and/or one or more process blocks of the methods of FIGS. 11-13. For example, the controller 130, the memory management component 250, the command detection component 260, the suspension control component 270, the suspension component 280 and/or the command execution component 290 may be configured to perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3:
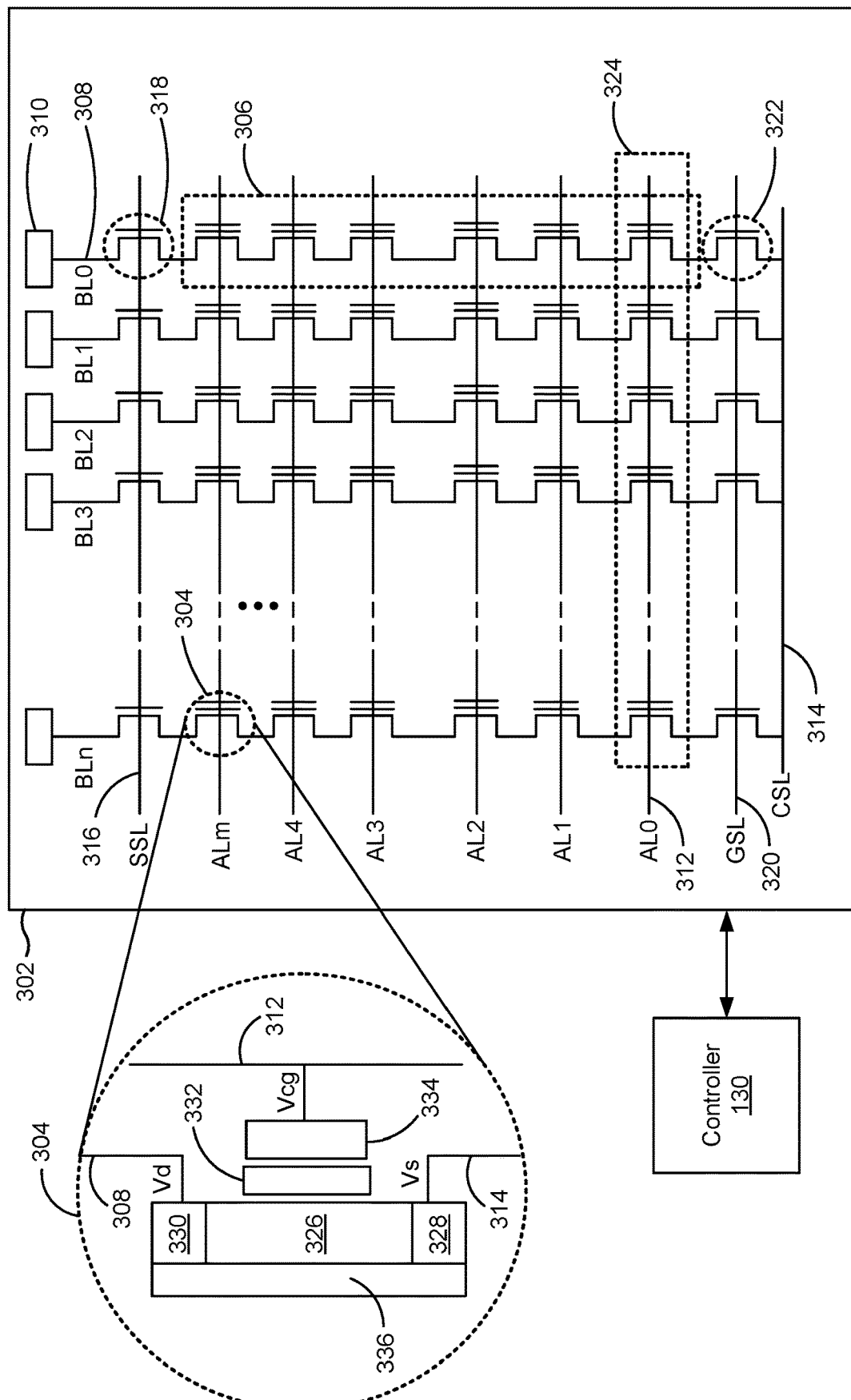

FIG. 3 is a diagram of example components included in a memory device 120. As described above in connection with FIG. 1, the memory device 120 may include a controller 130 and memory 140. As shown in FIG. 3, the memory 140 may include a memory array 302, which may correspond to a non-volatile memory array 210 described above in connection with FIG. 2.

In FIG. 3, the memory array 302 is a NAND memory array. However, in some implementations, the memory array 302 may be another type of memory array, such as a NOR memory array, a resistive RAM (RRAM) memory array, a magnetoresistive RAM (MRAM) memory array, a ferroelectric RAM (FeRAM) memory array, a spin-transfer torque RAM (STT-RAM) memory array, or the like. In some implementations, the memory array 302 is part of a three-dimensional stack of memory arrays, such as 3D NAND flash memory, 3D NOR flash memory, or the like.

The memory array 302 includes multiple memory cells 304. A memory cell 304 may store an analog value, such as an electrical voltage or an electrical charge, that represents a data state (e.g., a digital value). The analog value and corresponding data state depend on a quantity of electrons trapped or present within a region of the memory cell 304 (e.g., in a charge trap, such as a floating gate), as described below.

A NAND string 306 (sometimes called a string) may include multiple memory cells 304 connected in series. A NAND string 306 is coupled to a bit line 308 (sometimes called a digit line or a column line, and shown as BL0-BLn). Data can be read from or written to the memory cells 304 of a NAND string 306 via a corresponding bit line 308 using one or more input/output (I/O) components 310 (e.g., an I/O circuit, an I/O bus, a page buffer, and/or a sensing component, such as a sense amplifier). Memory cells 304 of different NAND strings 306 (e.g., one memory cell 304 per NAND string 306) may be coupled with one another via access lines 312 (sometimes called word lines or row lines, and shown as AL0-ALm) that select which row (or rows) of memory cells 304 is affected by a memory operation (e.g., a read operation or a write operation).

A NAND string 306 may be connected to a bit line 308 at one end and a common source line (CSL) 314 at the other end. A string select line (SSL) 316 may be used to control respective string select transistors 318. A string select transistor 318 selectively couples a NAND string 306 to a corresponding bit line 308. A ground select line (GSL) 320 may be used to control respective ground select transistors 322. A ground select transistor 322 selectively couples a NAND string 306 to the common source line 314.

A "page" of memory (or "a memory page") may refer to a group of memory cells 304 connected to the same access line 312, as shown by reference number 324. In some implementations (e.g., for single-level cells), the memory cells 304 connected to an access line 312 may be associated with a single page of memory. In some implementations (e.g., for multi-level cells), the memory cells 304 connected to an access line 312 may be associated with multiple pages of memory, where each page represents one bit stored in each of the memory cells 304 (e.g., a lower page that represents a first bit stored in each memory cell 304 and an upper page that represents a second bit stored in each memory cell 304). In NAND memory, a page is the smallest physically addressable data unit for a write operation (sometimes called a program operation).

In some implementations, a memory cell 304 is a floating-gate transistor memory cell. In this case, the memory cell 304 may include a channel 326, a source region 328, a drain region 330, a floating gate 332, and a control gate 334. The source region 328, the drain region 330, and the channel 326 may be on a substrate 336 (e.g., a semiconductor substrate). The memory device 120 may store a data state in the memory cell 304 by charging the floating gate 332 to a particular voltage associated with the data state and/or to a voltage that is within a range of voltages associated with the data state. This results in a predefined amount of current flowing through the channel 326 (e.g., from the source region 328 to the drain region 330) when a specified read voltage is applied to the control gate 334 (e.g., by a corresponding access line 312 connected to the control gate 334). Although not shown, a tunnel oxide layer (or tunnel dielectric layer) may be interposed between the floating gate 332 and the channel 326, and a gate oxide layer (e.g., a gate dielectric layer) may be interposed between the floating gate 332 and the control gate 334. As shown, a drain voltage Vd may be supplied from a bit line 308, a control gate voltage Vcg may be supplied from an access line 312, and a source voltage Vs may be supplied via the common source line 314 (which, in some implementations, is a ground voltage).

To write or program the memory cell 304, Fowler-Nordheim tunneling may be used. For example, a strong positive voltage potential may be created between the control gate 334 and the channel 326 (e.g., by applying a large positive voltage to the control gate 334 via a corresponding access line 312) while current is flowing through the channel 326 (e.g., from the common source line 314 to the bit line 308, or vice versa). The strong positive voltage at the control gate 334 causes electrons within the channel 326 to tunnel through the tunnel oxide layer and be trapped in the floating gate 332. These negatively charged electrons then act as an electron barrier between the control gate 334 and the channel 326 that increases the threshold voltage of the memory cell 304. The threshold voltage is a voltage required at the control gate 334 to cause current (e.g., a threshold amount of current) to flow through the channel 326. Fowler-Nordheim tunneling is an example technique for storing a charge in the floating gate, and other techniques, such as channel hot electron injection, may be used.

To read the memory cell 304, a read voltage may be applied to the control gate 334 (e.g., via a corresponding access line 312), and an I/O component 310 (e.g., a sense amplifier) may determine the data state of the memory cell 304 based on whether current passes through the memory cell 304 (e.g., the channel 326) due to the applied voltage. A pass voltage may be applied to all memory cells 304 (other than the memory cell 304 being read) in the same NAND string 306 as the memory cell 304 being read. For example, the pass voltage may be applied on each access line 312 other than the access line 312 of the memory cell 304 being read (e.g., where the read voltage is applied). The pass voltage is higher than the highest read voltage associated with any memory cell data states so that all of the other memory cells 304 in the NAND string 306 conduct, and the I/O component 310 can detect a data state of the memory cell 304 being read by sensing current (or lack thereof) on a corresponding bit line 308. For example, in a single-level memory cell that stores one of two data states, the data state is a "1" if current is detected, and the data state is a "0" if current is not detected. In a multi-level memory cell that stores one of three or more data states, multiple read voltages are applied, over time, to the control gate 334 to distinguish between the three or more data states and determine a data state of the memory cell 304.

To erase the memory cell 304, a strong negative voltage potential may be created between the control gate 334 and the channel 326 (e.g., by applying a large negative voltage to the control gate 334 via a corresponding access line 312). The strong negative voltage at the control gate 334 causes trapped electrons in the floating gate 332 to tunnel back across the oxide layer from the floating gate 332 to the channel 326 and to flow between the common source line 314 and the bit line 308. This removes the electron barrier between the control gate 334 and the channel 326 and decreases the threshold voltage of the memory cell 304 (e.g., to an empty or erased state, which may represent a "1").

As indicated above, FIG. 3 is provided as an example. Other examples may differ from what is described with regard to FIG. 3.

Figure 4:
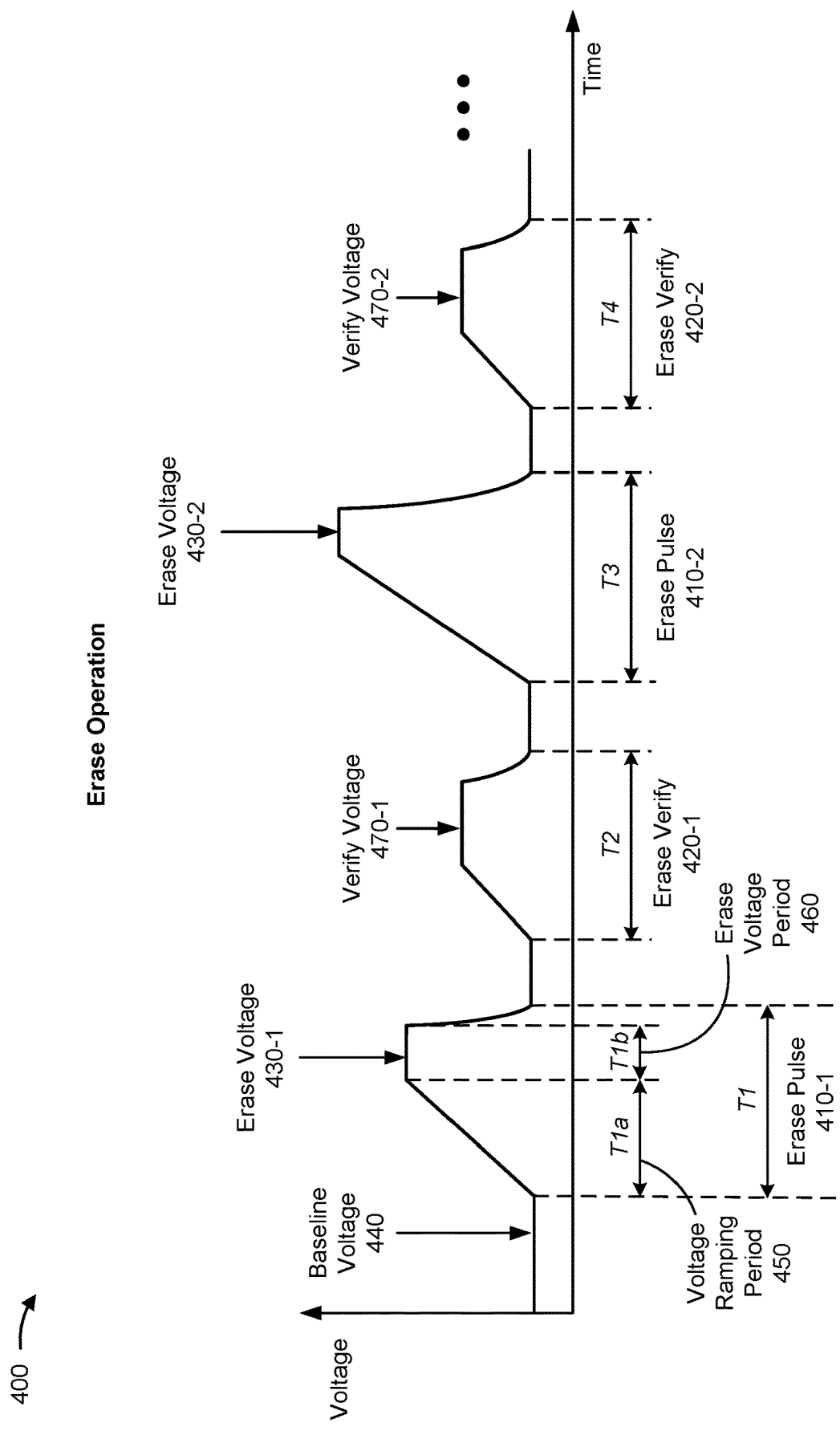
FIG. 4 is a diagram of an example erase operation.

FIG. 4 is a diagram of an example erase operation 400. The example erase operation 400 shown in FIG. 4 includes two erase pulse stages 410 and two erase verify stages 420. As further shown, the example erase operation 400 includes a first erase pulse stage 410-1 followed by a first erase verify stage 420-1, which is followed by a second erase pulse stage 410-2 followed by a second erase verify stage 420-2. Each erase pulse stage 410 is associated with an erase voltage 430. As shown, a second erase voltage 430-2 of the second erase pulse stage 410-2 is greater (e.g., in magnitude) than a first erase voltage 430-1 of the first erase pulse stage 410-1, which is explained below. In some implementations, the erase operation 400 may be applied to a block of memory to erase the memory cells included in that block.

As shown in FIG. 4, when a memory device 120 performs the erase operation 400, the memory device 120 raises the voltage on selected access lines (e.g., access lines included in a block of memory) from a baseline voltage 440 to the first erase voltage 430-1 during a first time period T1 that corresponds to the first erase pulse stage 410-1. The first erase voltage 430-1 erases a first set of memory cells (sometimes called pass memory cells) on the selected access lines by programming the first set of memory cells to a desired state (e.g., an erase state, sometimes represented by a value of 1) and fails to erase a second set of memory cells (sometimes called fail memory cells) on the selected access lines (e.g., by failing to program the second set of memory cells to the erase state). After applying the first erase voltage 430-1, the memory device 120 may reduce the voltage on the selected access lines to the baseline voltage 440.

As further shown in FIG. 4, an erase pulse stage 410 may include a voltage ramping period 450 and an erase voltage period 460. As shown, the voltage ramping period 450 may occur within a first time window T1a that is within the first time period T1 during which the erase pulse stage 410 is performed. During the voltage ramping period 450, the voltage applied to the selected access lines increases from the baseline voltage 440 to the erase voltage 430. In other words, the memory device 120 may increase the voltage applied to the selected access lines from the baseline voltage 440 to the erase voltage 430 during the voltage ramping period 450.

The erase voltage period 460 may follow the voltage ramping period 450. For example, the erase voltage period 460 may occur within a second time window T1b that is within the first time period T1 during which the erase pulse stage 410 is performed. The end of the first time window T1a and the beginning of the second time window T1b are the same because the erase voltage period 460 begins after the voltage has increased (or ramped up) from the baseline voltage 440 to the erase voltage 430 (e.g., in the voltage ramping period 450). During the erase voltage period 460, the erase voltage 430 is applied to the selected access lines. In other words, the memory device 120 may apply the erase voltage 430 to the selected access lines during the erase voltage period 460. The memory device 120 may apply the erase voltage 430 for the entirety of the erase voltage period 460, and may then reduce the voltage on the selected access lines to the baseline voltage 440.

The memory device 120 may then raise the voltage on the selected access lines from the baseline voltage 440 to a first verify voltage 470-1 (e.g., during a ramping time period of the erase verify stage 420) during a second time period T2 that corresponds to the erase verify stage 420. After raising the voltage to the first verify voltage 470-1, the memory device 120 may perform a sensing operation (e.g., a read operation), during a sensing time period of the erase verify stage 420, to detect whether the first verify voltage 470-1 applied to a memory cell causes that memory cell to conduct (e.g., whether current flows through the memory cell when the first verify voltage 470-1 is applied). Based on a desired state of the memory cell (e.g., an erase state) and based on whether the memory cell conducts when the first verify voltage 470-1 is applied, the memory device 120 may identify the memory cell as a pass memory cell that stores the desired state or a fail memory cell that does not store the desired state. For example, in a single-level memory cell that stores one of two data states, the memory device 120 may apply a verify voltage 470 that is between a first threshold voltage corresponding to a first data state (e.g., 1) and a second threshold voltage corresponding to a second data state (e.g., 0). In this example, the memory cell stores the first data state (e.g., 1) if current is detected, and the memory cell stores the second data state (e.g., 0) if current is not detected. After applying the first verify voltage 470-1, the memory device 120 may reduce the voltage on the selected access line to the baseline voltage 440.

The memory device 120 may then raise the voltage on the selected access lines from the baseline voltage 440 to the second erase voltage 430-2 during a third time period T3 that corresponds to the second erase pulse stage 410-2. The second erase voltage 430-2 is greater in magnitude than the first erase voltage 430-1, which causes some or all of the fail memory cells (e.g., that were not successfully programmed to the erase state based on application of the first erase voltage 430-1) to be programmed to the desired state (e.g., to be erased to the erase state). After applying the second erase voltage 430-2, the memory device 120 may reduce the voltage on the selected access lines to the baseline voltage 440. In some implementations, the memory device 120 may then perform another erase verify operation during a second erase verify stage 420-2 (e.g., by applying a second verify voltage 470-2), in a similar manner as described above in connection with the first erase verify stage 420-1.

In some implementations, memory cells that were successfully erased by the first erase voltage 430-1, as determined during the first erase verify stage 420-1, may be inhibited from being erased with the second erase voltage 430-2. This may increase endurance and prolong a lifespan of those memory cells, as compared to a scenario where the second erase voltage 430-2 is applied to those memory cells, by preventing the second erase voltage 430-2 from causing degradation of those memory cells.

In some implementations, the erase verify stage 420 may include determining whether an erase condition is satisfied. For example, the memory device 120 may determine whether a quantity or a percentage of successfully erased memory cells (e.g., pass memory cells) satisfies a threshold and/or whether a quantity or percentage of un-erased memory cells (e.g., fail memory cells) satisfies a threshold. Based on whether the condition is satisfied, the memory device 120 may selectively apply an additional erase voltage 430 (e.g., with a greater voltage than a most recently applied erase voltage 430) during an additional erase pulse stage 410, and may perform an additional erase verify operation during an additional erase verify stage 420 until the condition is satisfied. For example, if the quantity or percentage of pass memory cells is less than or equal to a threshold (and/or if the quantity or percentage of fail memory cells is greater than or equal to a threshold), then the memory device 120 may apply the additional erase pulse and perform the additional erase verify operation. Conversely, if the quantity or percentage of pass memory cells is greater than or equal to a threshold (and/or if the quantity or percentage of fail memory cells is less than or equal to a threshold), then the memory device 120 may complete the erase operation during an erase completion stage (not shown).

The erase completion stage may occur after a final erase verify stage 420 (e.g., after an erase condition is satisfied). In some implementations, the erase completion stage may include storing a log of erase results (e.g., an indication of a quantity or percentage of pass and/or fail memory cells, an indication of memory addresses of fail memory cells, or the like), determining whether the erase operation 400 passed or failed, and/or storing an indication that the erased block is a bad block if the erase operation 400 failed. Thus, although the example erase operation 400 of FIG. 4 is shown as including two erase pulse stages 410 and two erase verify stages 420, the erase verify operation 400 may include a different quantity of erase pulse stages 410 and/or erase verify stages 420.

In some implementations, the erase operation 400 may include an erase preparation stage that is performed prior to the first erase pulse stage 410-1. The erase preparation stage may include, for example, transferring data from valid memory cells, of the memory block to be erased, to other memory cells in another memory block (e.g., so that valid data is not erased).

In some implementations, the erase preparation stage, the erase completion stage, and/or the erase verify stage 420 has a duration that is less than a read requirement (e.g., a host read requirement) associated with the memory device 120. The read requirement may indicate a required time in which a read command must be executed and/or data read from memory must be transmitted to a host device after reception of the read command. For example, the read requirement may be 1 millisecond. In some implementations, the erase preparation stage, the erase completion stage, and/or the erase verify stage 420 has a duration of approximately 0.5 milliseconds (e.g., 500 microseconds).

In some implementations, the erase pulse stage 410 has a duration that is greater than the read requirement. For example, the erase pulse stage 410 may have a duration of approximately 1.6 milliseconds. Thus, the erase pulse stage 410 may need to be suspended to enable the read requirement to be satisfied when a host read command is received during the erase pulse stage 410. However, if the erase pulse stage 410 is in a voltage ramping period 450 and is immediately suspended upon reception of a host read command, then no progress is made toward erasing memory cells (e.g., because the voltage has not yet reached the erase voltage 430 that is applied to memory cells to erase those memory cells). Some implementations described herein prevent suspension of an erase pulse stage 410 during the voltage ramping period 450 (and/or a minimum time period thereafter), such that progress toward erasure is made during each erase pulse stage 410 prior to suspending the erase operation. This may reduce the overall amount of time required to perform the erase operation (e.g., as compared to suspending the erase pulse stage 410 during the voltage ramping period 450), may lead to less degradation of memory cells due to the erase operation (e.g., via less overall voltage applied to those memory cells), may result in less power consumption (e.g., via less overall voltage applied to memory cells), may extend a lifespan of the memory device, and may reduce latency associated with performing other memory operations (e.g., that are queued for execution after the erase operation is complete).

Although the above example is described in connection with the erase pulse stage 410, the techniques described herein can be applied to other stages of the erase operation, such as the erase verify stage 420, the erase preparation stage, and/or the erase completion stage. For example, in some cases, the duration of one or more of these stages may be greater than the read requirement. As a result, one or more of these stages may need to be suspended to execute the host read command and satisfy the read requirement. Furthermore, even if the duration of an erase operation stage (e.g., the erase pulse stage 410, the erase verify stage 420, the erase preparation stage, and/or the erase completion stage) is less than the read requirement, that duration may not be sufficiently less than the read requirement to allow the read command to be performed in a manner that satisfies the read requirement (e.g., if the duration of the erase operation stage plus the amount of time needed to execute the read command is greater than the read requirement). In general, techniques described herein enable a read requirement to be satisfied by selectively suspending an erase operation stage based on one or more parameters, which enables a balance between satisfying the read requirement and reducing an overall duration of the erase operation (e.g., from initiation to completion).

As indicated above, FIG. 4 is provided as an example. Other examples may differ from what is described with regard to FIG. 4.

FIG. 5 is a diagram of an example prioritization of memory operations. FIG. 5 shows a table with example memory operations and corresponding priority levels.

As shown by reference number 505, in the example of FIG. 5, host read operations (as well as host read commands) have the highest priority relative to other memory operations, shown as a priority level of P3. A host read command may trigger performance of a host read operation (e.g., based on execution of the host read command). A host read command may be a read command that is received from the host device 110. For example, the host read command may be generated by and/or received from a host device 110 that is in communication with the memory device 120. In some implementations, the host read command is received by the memory device 120 via the host interface 150. The host read command may be a command instructing the memory device 120 to read data from the memory 140 and provide that data to the host device 110 (e.g., via the host interface). In some implementations, the controller 130 may determine that a read command is a host read command based on the read command being received from the host device 110, based on the read command being received via the host interface 150 (e.g., a particular interface and/or pin of the memory device 120), based on the read command not being generated internally by the memory device 120, and/or based on the read command including a particular value or instruction (e.g., an instruction to read data from the memory 140 and provide that data to the host device 110).

A host read command may include, for example, a multi-plane host read command or a single plane host read command. A multi-plane host read command is a command to read data that is stored in more than one memory plane of the memory device 120. For example, a first portion of the data may be stored in a first memory plane, a second portion of the data may be stored in a second memory plane, and so on. A single plane host read command is a command to read data that is stored in a single memory plane of the memory device 120. The memory device 120 may include one or more semiconductor dies. A semiconductor die may be the smallest unit of memory that can independently execute commands, and a semiconductor die may include multiple memory planes (sometimes called "planes"). In some implementations, identical and concurrent operations can be performed on multiple memory planes (sometimes with restrictions) of a semiconductor die. A memory plane may include multiple memory blocks (sometime called "blocks"). A memory block is the smallest unit of memory that can be erased (e.g., using an erase operation described herein).

As shown by reference number 510, in the example of FIG. 5, write operations and erase operations (as well as write commands and erase commands) have the second-highest priority relative to other memory operations, shown as a priority level of P2. For example, write operations and erase operations may be lower priority than host read commands and higher priority than other memory commands. A write command may trigger performance of a write operation (e.g., based on execution of the write command). Similarly, an erase command may trigger performance of an erase operation (e.g., based on execution of the erase command). In some implementations, write commands and erase commands have a same priority because a write operation would not be performed on a memory block while that memory block is being erased, and an erase operation would not be performed on a memory block while that memory block is being written. As an example, an erase command may include a command to erase a block of memory.

As an example, a write command (e.g., having the priority level of P2) may include a host write command or a non-host write command. A host write command is a write command received from a host device 110, such as a command from a host device 110 to write data to memory. A non-host write command is a write command that is not received from the host device 110. For example, a non-host write command may be generated internally by the memory device 120. A non-host write command may include, for example, a garbage collection (GC) write command, a flash translation layer (FTL) write command, a file system area (FSA) write command, or a redundant array of independent NAND (RAIN) write command. A GC write command may include a command to write valid data from a first block of memory to a second block of memory, such as prior to erasing the first block of memory. An FTL write command may include a command to write an address table and/or a translation table (e.g., a physical to logical translation table, block address table, and/or a logical block address table) to non-volatile memory (e.g., from volatile memory). An FSA write command may include a command to write log data (e.g., a log file) to memory. A RAIN write command may include a command to write RAIN parity bits to memory.

As shown by reference number 515, in the example of FIG. 5, non-host read operations (as well as non-host read commands) may have a lower priority than write operations and erase operations, shown as a priority level of P1 for some non-host read operations and a priority level of P0 (e.g., lowest priority) for other non-host read operations. A non-host read command is a read command that is not received from the host device 110. For example, a non-host read command may be generated internally by the memory device 120. A non-host read command may include, for example, a GC read command, a data integrity scan read command, an FTL read command, or an FSA read command.

As shown by reference number 520, in the example of FIG. 5, GC read operations (as well as GC read commands) have the third-highest (or second-lowest) priority relative to other memory operations, shown as a priority level of P1. For example, GC read operations may be lower priority than host read commands, write commands, and erase commands, and may be higher priority than other memory commands. A GC read command may trigger performance of a GC read operation (e.g., based on execution of the GC read command). A GC read command may include a command to read valid data from a first block of memory so that the valid data can be written to a second block of memory, such as prior to erasing the first block of memory.

As shown by reference number 525, in the example of FIG. 5, non-host, non-GC read operations (as well as non-host, non-GC read commands) have the fourth-highest (or lowest) priority relative to other memory operations, shown as a priority level of P0. For example, non-host, non-GC read operations (shown as "other internal read" operations) may be lower priority than host read commands, write commands, erase commands, and GC read commands, and may the same priority as non-read, non-write, non-erase commands. A non-host, non-GC read command may include, for example, a data integrity scan read command, an FTL read command, or an FSA read command. A data integrity scan read command may include a command to read data from memory for data verification and/or error checking. An FTL read command may include a command to read an address table and/or a translation table (e.g., a physical to logical translation table, block address table, and/or a logical block address table) from non-volatile memory. An FSA read command may include a command to read log data (e.g., a log file) from memory.

As shown by reference number 530, in the example of FIG. 5, non-host, non-GC read operations (described above) and non-read, non-write, non-erase operations (as well as non-read, non-write, and non-erase commands) have the fourth-highest (or lowest) priority relative to other memory operations, shown as a priority level of P0. A non-read, non-write, non-erase operation (shown as an "other" operation) is sometimes called an out-of-band (OOB) operation. An OOB operation may include an operation that is not performed on a memory array of the memory device 120 (e.g., that does not write data to a memory array, does not read data from a memory array, and does not erase a memory array). For example, an OOB operation may include a request to obtain a unique identifier of the memory device 120, a request for on-demand paging (ODP), a request to obtain a temperature of the memory device 120, and/or an administrative command (e.g., a request to get a feature or a request to set a feature).

Some implementations described herein relate to suspending an erase operation to perform a memory operation having a higher priority than the erase operation. In the example prioritization of FIG. 5, an erase operation may be suspended to perform a host read operation, such as a single plane host read operation or a multi-plane host read operation, and may not be suspended for any other type of memory operation shown in FIG. 5. However, in some implementations, memory operations may be prioritized in a different manner than shown in FIG. 5, and an erase operation may be suspended to perform a memory operation other than a host read operation.

As indicated above, FIG. 5 is provided as an example. Other examples may differ from what is described with regard to FIG. 5.

Figure 6:
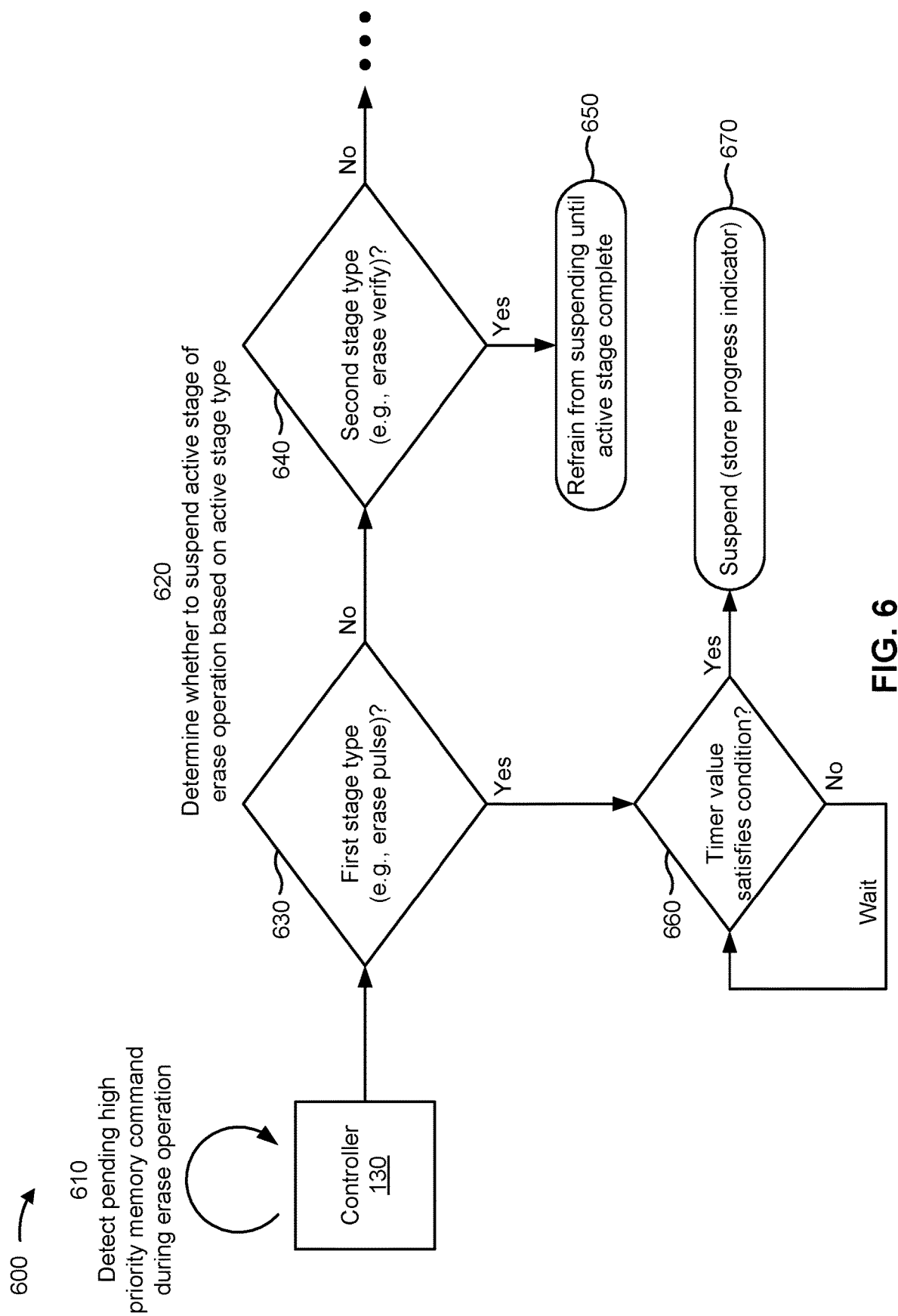
FIGS. 6-10 are diagrams of examples of suspending memory erase operations to perform high priority memory commands.

FIG. 6 is a diagram of an example 600 of suspending memory erase operations to perform high priority memory commands. The operations described in connection with FIG. 6 may be performed by the memory device 120 and/or one or more components of the memory device 120, such as the controller 130.

As shown by reference number 610, the controller 130 may detect a pending high priority memory command during an erase operation. For example, the controller 130 and/or the memory device 120 may perform or trigger performance of the erase operation, which may include multiple stages, as described above in connection with FIG. 4. The controller 130 may detect, while an active stage of an erase operation is being performed by the memory device 120, a pending memory command with a higher priority than the erase operation. For example, according to the example memory operation prioritization described above in connection with FIG. 5, the controller 130 may detect a pending host read command, which has a higher priority than the erase operation. However, in some implementations, another type of memory command may have a higher priority than the erase operation, such as a GC read operation or a RAIN write operation, and the controller 130 may detect this type of memory command. In some implementations, the high priority memory command is associated with a requirement, such as a requirement that the command be executed (e.g., that execution of the command be initiated or that execution of the command be completed) in a threshold amount of time after generation or reception of the command.

In some implementations, the memory device 120 may store commands in a queue (e.g., in memory 140) prior to execution by the memory device 120. In this case, the controller 130 may determine whether the queue (e.g., a command queue) includes any commands with a higher priority than the erase operation, such as a host read command. In some implementations, the controller 130 may periodically check the queue for pending high priority memory operations. Additionally, or alternatively, the controller 130 may receive an indication when a command is added to the queue, and may determine whether the added command is a high priority command. If the queue does not include any high priority commands, then the memory device 120 may continue with execution of the erase operation (e.g., the controller 130 refrains from suspending the erase operation).

If the queue includes a high priority command or the controller 130 otherwise detects a high priority command, then the controller 130 may selectively suspend the erase operation (e.g., an active stage of the erase operation). As used herein, "selectively suspend" means to suspend or refrain from suspending. For example, selectively suspending an active stage of an erase operation based on a condition means that the active stage is suspended if the condition is satisfied and that the active stage is not suspend if the condition is not satisfied (or vice versa). Thus, "selectively suspending" an active stage of an erase operation may include determining whether to suspend the active stage and then either suspending or refraining from suspending the active stage based on that determination.

As shown by reference number 620, in some implementations, the controller 130 may determine whether to suspend an active stage of the erase operation based on the active stage (e.g., based on a type of the active stage, sometimes called an active stage type). An "active stage" is a stage of the erase operation that is being performed at a time when the high priority command is received or detected and/or a stage of the erase operation that is being performed at a time when the controller 130 determines whether to suspend the erase operation. Example erase operation stages include an erase preparation stage, an erase pulse stage, an erase verify stage, and an erase completion stage, as described above in connection with FIG. 4.

In some implementations, the controller 130 may suspend the active stage of the erase operation if the active stage is a first type of stage (sometimes called a first stage type), and may refrain from suspending the active stage of the erase operation if the active stage is a second type of stage (sometimes called a second stage type). For example, the controller 130 may suspend the active stage if the active stage is an erase pulse stage, and may refrain from suspending the active stage if the active stage is a stage other than an erase pulse stage (e.g., if the active stage is not an erase pulse stage), as described above in connection with FIG. 4. For example, the controller 130 may refrain from suspending the active stage if the active stage is an erase verify stage, an erase preparation stage, or an erase completion stage. As another example, the controller 130 may suspend the active stage if the active stage has a duration that is greater than (or equal to) a threshold (e.g., where the threshold depends on a requirement, such as a read requirement or a write requirement), and may refrain from suspending the active stage if the active stage has a duration that is less than (or equal to) the threshold, as also described above in connection with FIG. 4. However, finer-grained control of whether to suspend the active stage of the erase operation may be desired for reasons described elsewhere herein.

If the controller 130 suspends the active stage, then the controller 130 may execute the pending high priority memory command while the active stage is suspended. If the controller 130 refrains from suspending the active stage, then the controller 130 may execute the pending high priority memory command after the active stage is complete. This may enable a requirement associated with performing the high priority memory command to be satisfied.

As shown by reference number 630, the controller 130 may determine whether the active stage is a first type of stage, such as an erase pulse stage. As shown by reference number 640, if the active stage is not the first type of stage, then the controller 130 may determine whether the active stage is a second type of stage, such as an erase verify stage, an erase preparation stage, or an erase completion stage. As shown by reference number 650, if the active stage is the second type of stage, then the controller 130 may refrain from suspending the active stage. For example, the controller 130 may refrain from suspending the erase operation, to execute the high priority memory command, until the active stage is complete. For example, the second type of stage may have a duration that is less than (or equal to) a threshold, which enables a requirement associated with the high priority memory command to be satisfied even if the second type of stage is not suspended. In this case, the controller 130 may wait to suspend the erase operation until the active stage is complete, which may reduce an overall amount of time to perform the erase operation (e.g., as compared to suspending the active stage and later re-starting the active stage after resuming the erase operation) while still enabling the requirement to be satisfied.

As shown by reference number 660, if the active stage is the first type of stage, then the controller 130 may determine whether a value of a timer (i.e., a timer value) satisfies a condition. The timer may be called a suspend determination timer because the timer may be used to determine whether to suspend the active stage. In some implementations, the timer may be reset when an active stage begins, and may begin running or counting during execution of the active stage. Thus, the timer value may represent an elapsed time associated with the active stage. The controller 130 may determine a value of the suspend determination timer when the high priority memory command is received, when the high priority memory command is detected (e.g., by the controller 130), or when the controller 130 is determining whether to suspend the active stage. For example, detection of the high priority memory command may trigger the controller 130 to determine the value of the suspend determination timer.

If the timer value does not satisfy the condition, then the controller 130 may wait while the active stage continues to be performed. As shown by reference number 670, when the timer value satisfies the condition, the controller 130 may suspend the active stage. In some implementations, the controller 130 may store a progress indicator that indicates progress of the active stage (e.g., based on the timer value), such that the active stage can later be resumed (e.g., after the high priority memory command is executed) based on the progress indicator. In some implementations, the progress indicator may indicate an elapsed time in the active stage and/or an amount of time that a target voltage (e.g., an erase voltage or a verify voltage) was applied during the active stage prior to suspension. The controller 130 may execute one or more high priority memory commands after suspending the active stage of the erase operation (e.g., while the active stage is suspended).

In some implementations, the controller 130 executes a single high priority memory command, and then resumes the erase operation, either at a stage that was suspended or at a next stage if the active stage was not suspended (e.g., if the erase operation was suspended after the active stage was completed). Alternatively, the controller 130 may execute multiple pending high priority memory commands. In some implementations, the quantity of high priority memory commands that are executed while the erase pulse stage is suspended may be based on a threshold, such as a maximum execution count. The maximum execution count may be stored in memory 140 of the memory device 120. In some implementations, the maximum execution count is based on the type of high priority memory command that causes the erase operation to be suspended. For example, a higher priority memory command may be associated with a higher maximum execution count than a lower priority memory command. Thus, in some implementations, the controller 130 executes a quantity of high priority memory commands that is less than or equal to the maximum execution count. After execution of the one or more high priority memory commands is finished, the controller 130 may resume the erase operation, such as by resuming the active stage based on the progress indicator. Additional details are described below in connection with FIGS. 9-10.

In some implementations, the condition associated with the timer value is that the timer value is greater than or equal to a threshold (sometimes called a first threshold or a minimum threshold). Requiring the timer value to be greater than or equal to a threshold before suspending the active stage may ensure that a voltage ramping period, included in the active stage, has finished and that a target voltage, that is reached at the end of the voltage ramping period, is applied for some period of time. This ensures that some progress (e.g., application of a target voltage) is made during the active stage before the active stage is suspended. As a result, the active stage may later be resumed where progress was left off (e.g., after voltage ramping), and a length of time during which the target voltage is applied can be reduced (e.g., as compared to performing the entire active stage again). Additional details are described below in connection with FIGS. 9-10.

Alternatively, the condition associated with the timer value may be that the timer value is less than or equal to a threshold (sometimes called a second threshold or a maximum threshold). Requiring the timer value to be less than or equal to a threshold to suspend the active stage ensures that the active stage is not suspended near an end of the active stage (e.g., within a threshold amount of time of the end of the active stage). This allows the active stage to be completed prior to suspending the erase operation if waiting to execute the high priority memory command (e.g., until after the active stage is completed) will satisfy a requirement. Additional details are described below in connection with FIGS. 9-10.

In some implementations, the condition associated with the timer value may be that the timer value is greater than or equal to a first threshold (e.g., described above) and is less than or equal to a second threshold (e.g., described above). In some implementations, the first threshold and/or the second threshold (and thus, the condition) may be based on the type of high priority memory command, an execution time associated with the high priority memory command, a requirement associated with the high priority memory command, an active stage being performed (e.g., an active stage type), and/or an execution time of the active stage. For example, the first threshold and/or the second threshold (and thus, the condition) may be configured such that the high priority memory command can be executed to satisfy the requirement. However, rather than immediately suspending the active stage of the erase operation, the controller 130 may allow the active stage to continue to execute if a target voltage has not yet been applied and/or if the active stage is nearly complete. This may reduce the amount of time required to perform the erase operation, may cause less degradation of memory cells due to the erase operation, may result in less power consumption, may extend a lifespan of the memory device, and may reduce latency associated with performing other memory operations all while still satisfying the requirement associated with the high priority memory command.

Although FIG. 6 shows two stage types as an example, the controller 130 may perform techniques described herein in connection with more than two stage types. In some implementations, different stage types may be associated with different conditions for determining whether that stage type is to be suspended.

As indicated above, FIG. 6 is provided as an example. Other examples may differ from what is described with regard to FIG. 6.

Figure 7:
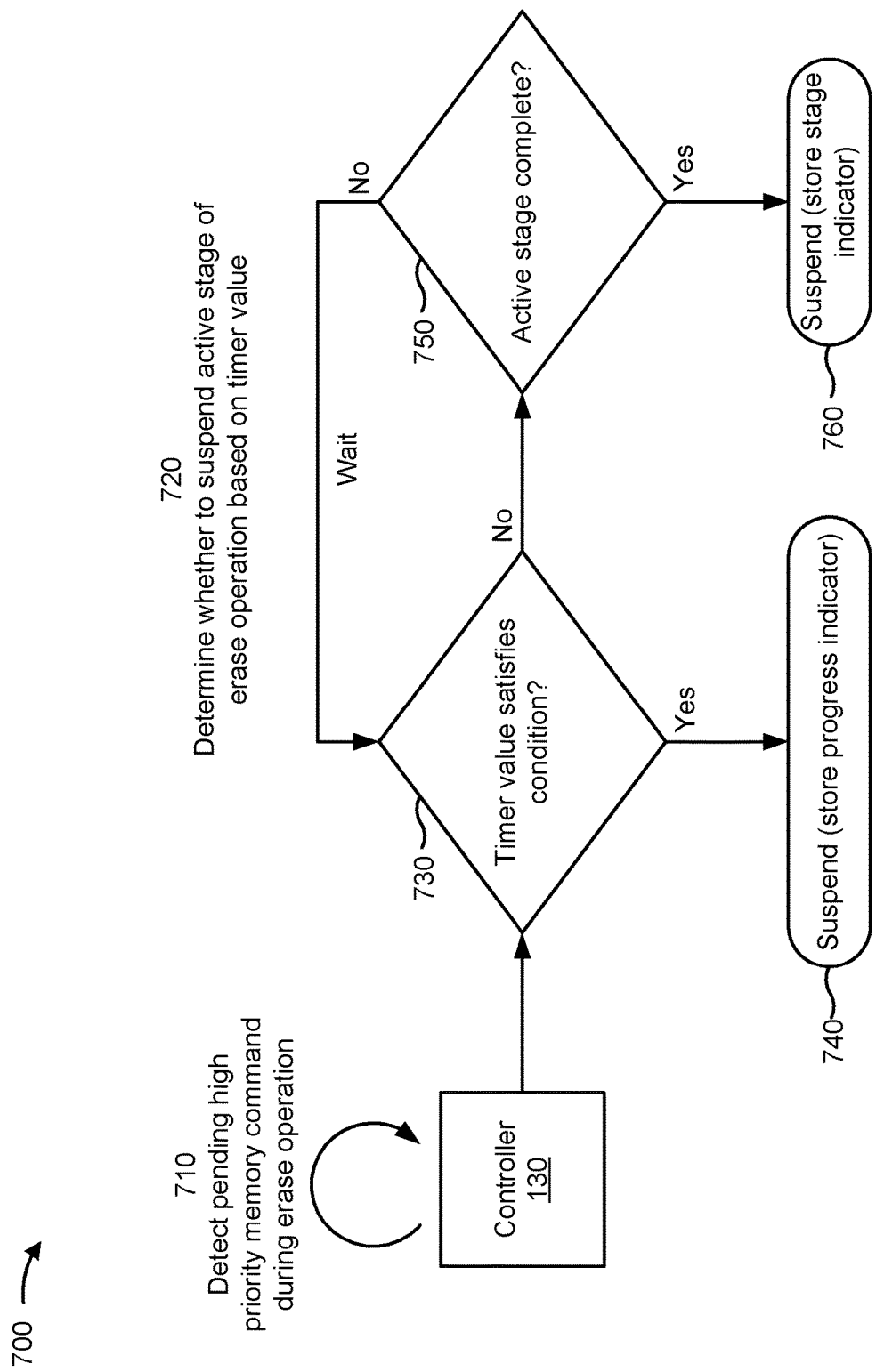

FIG. 7 is a diagram of an example 700 of suspending memory erase operations to perform high priority memory commands. The operations described in connection with FIG. 7 may be performed by the memory device 120 and/or one or more components of the memory device 120, such as the controller 130.

As shown by reference number 710, the controller 130 may detect a pending high priority memory command during an erase operation (and/or during an active stage of the erase operation), as described above in connection with reference number 610 of FIG. 6.

As shown by reference number 720, in some implementations, the controller 130 may determine whether to suspend an active stage of the erase operation based on a timer value (e.g., a suspend determination timer value, as described above). As described above, the timer may be initiated or reset at the beginning of an active stage (e.g., at the beginning of each active stage). Thus, the timer value may represent an elapsed time in that active stage. The controller 130 may selectively suspend the active stage based on the timer value, such as based on whether the timer value satisfies a condition.

In some implementations, the controller 130 may suspend the active stage of the erase operation if the timer value satisfies a condition, and may refrain from suspending the active stage of the erase operation if the timer value does not satisfy the condition. If the controller 130 suspends the active stage, then the controller 130 may execute the pending high priority memory command while the active stage is suspended. If the controller 130 refrains from suspending the active stage, then the controller 130 may execute the pending high priority memory command after the active stage is complete. This may enable a requirement associated with performing the high priority memory command to be satisfied.

As described above in connection with FIG. 6, the condition may be that the timer value is greater than or equal to a threshold (sometimes called a first threshold or a minimum threshold), that the timer value is less than or equal to a threshold (sometimes called a second threshold or a maximum threshold), or that the timer value is greater than (or equal to) a first threshold and is less than (or equal to) a second threshold. In some implementations, the condition may be based on the active stage (e.g., a type of the active stage). For example, some active stages, such as the erase preparation stage or the erase completion stage, may not include a voltage ramping period. In this case, there may not be a need to ensure that the timer value is greater than or equal to a first threshold. However, for an active stage that includes a voltage ramping period, such as the erase pulse stage or the erase verify stage, the condition may include the timer value being greater than or equal to the first threshold to ensure that progress is made in that active stage after the voltage ramping period.

Additionally, or alternatively, the first threshold and/or the second threshold may be based on the active stage (e.g., a type of the active stage). For example, different types of active stages may have different durations of voltage ramping period. For example, a voltage ramping period of an erase pulse stage may be longer than a voltage ramping period of an erase verify stage because a target voltage (e.g., an erase voltage) of the erase pulse stage is greater than a target voltage (e.g., a verify voltage) of the erase verify stage. This, the first threshold may be a larger value for the erase pulse stage as compared to the erase verify stage. However, in some implementations, the same condition and/or the same threshold (e.g., the same first threshold and/or the same second threshold) may be used for all stages of the erase operation (e.g., at least the stages described above in connection with FIG. 4) to reduce complexity.

As an example, and as shown by reference number 730, the controller 130 may determine whether the timer value satisfies a condition, in a similar manner as described above in connection with reference number 660 of FIG. 6. In some implementations, the controller 130 may determine whether the time value satisfies the condition based on detecting the pending high priority memory command during the erase operation. As shown by reference number 740, if the timer value satisfies the condition, then the controller 130 may suspend the active stage, as described above in connection with reference number 670 of FIG. 6. In some implementations, the controller 130 may store a progress indicator, as also described above in connection with FIG. 6.

In some implementations, the controller 130 may selectively store a progress indicator based on the active stage. For example, the controller 130 may store a progress indicator for a first stage type, and may refrain from storing a progress indicator for the second stage type. In this case, when the first stage type resumes, the first stage type may be performed based on the progress indicator (e.g., a duration of the first stage type may be shorter as compared to performing the entire first stage type). Furthermore, when the second stage type resumes, the entire second stage type may be performed based on the progress indicator. In some implementations, the first stage type is a stage that includes a voltage ramping period, such as the erase pulse stage or the erase verify stage, and the second stage type is a stage that does not include a voltage ramping period, such as an erase preparation stage or an erase completion stage.

As shown by reference number 750, if the timer value does not satisfy the condition, then the controller 130 may wait while the active stage continues to be performed, and may determine whether the active stage is complete. As shown by reference number 760, if the active stage is complete, then the controller 130 may suspend the erase operation to perform the high priority memory command. In some implementations, the controller 130 may store a stage indicator that indicates a stage that was completed or a next stage to be performed when the erase operation is resumed. After executing the high priority memory command, the controller 130 may determine a next stage of the erase operation to be performed based on the stage indicator, and may perform the next stage. If the active stage is not complete, then the controller 130 may continue to determine whether the timer value satisfies the condition and/or whether the active stage is complete.

As indicated above, FIG. 7 is provided as an example. Other examples may differ from what is described with regard to FIG. 7.

Figure 8:
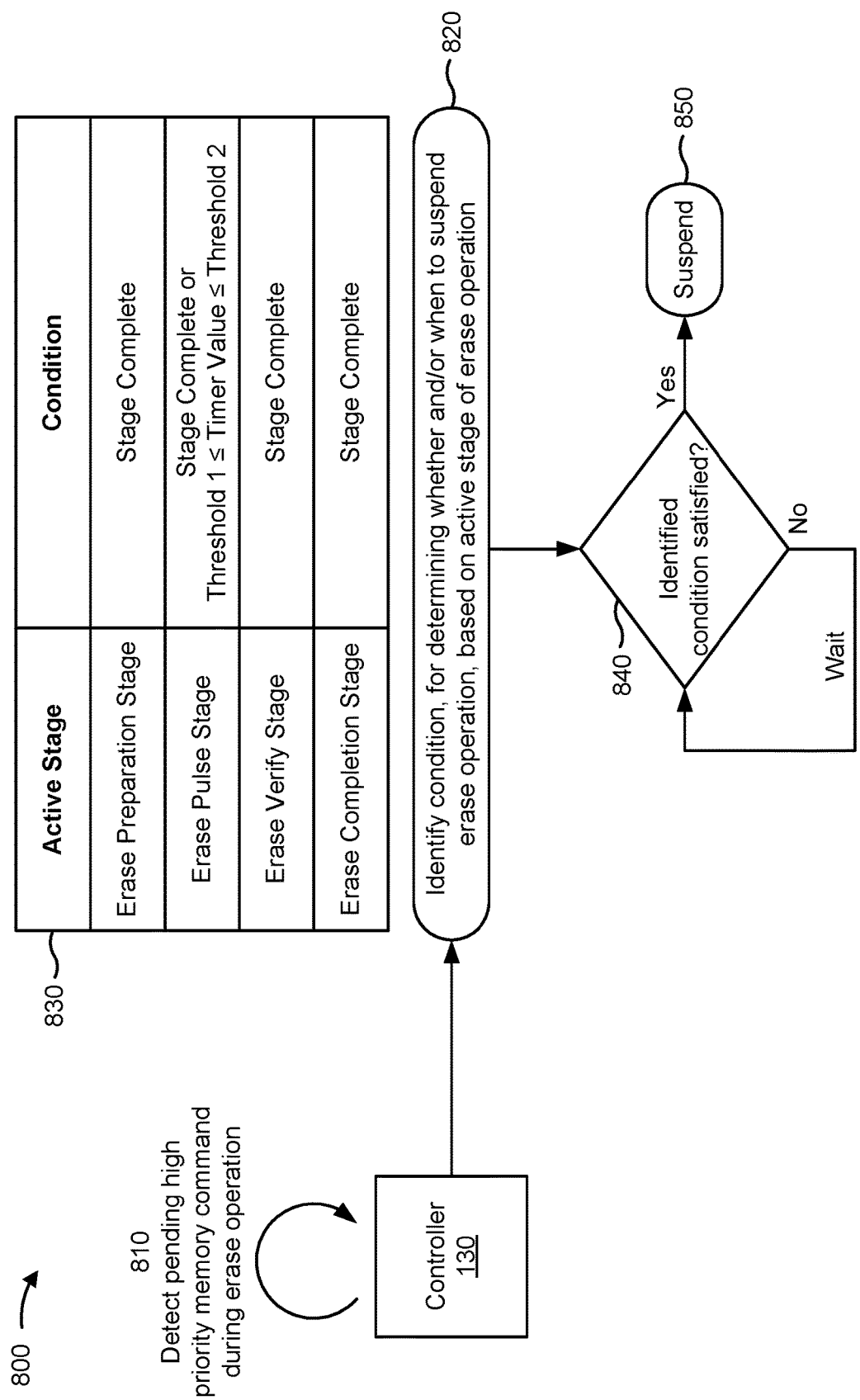

FIG. 8 is a diagram of an example 800 of suspending memory erase operations to perform high priority memory commands. The operations described in connection with FIG. 8 may be performed by the memory device 120 and/or one or more components of the memory device 120, such as the controller 130.

As shown by reference number 810, the controller 130 may detect a pending high priority memory command during an erase operation (and/or during an active stage of the erase operation), as described above in connection with reference number 610 of FIG. 6. As shown by reference number 820, the controller 130 may identify a condition, for determining whether and/or when to suspend the erase operation, based on an active stage of the erase operation (e.g., an active stage that is currently being performed or executed). In some implementations, the controller 130 may identify a first condition if the active stage is a first type of stage (e.g., an erase pulse stage), and the controller 130 may identify a second condition if the active stage is a second type of stage (e.g., an erase verify stage, an erase preparation stage, or an erase completion stage).

As shown by reference number 830, and as an example, if the active stage is an erase pulse stage, then the condition (e.g., a first condition) for suspending the erase operation may be that either the active stage is complete or a timer value associated with the active stage satisfies a timer condition (e.g., is greater than or equal to a first threshold and/or is less than or equal to a second threshold). For example, if the controller 130 detects the pending high priority memory command during the erase pulse stage, then the controller 130 may suspend the erase operation if the timer value satisfies a timer condition. This timer condition may prevent the erase operation from being suspended during a voltage ramping period of the erase pulse stage, as described elsewhere herein. Additionally, or alternatively, the timer condition may prevent the erase operation from being suspended within a threshold time period before an end of the erase pulse stage, as described elsewhere herein.

If the timer value does not satisfy the timer condition and the timer value is less than the first threshold, then the controller 130 may wait for the timer value to satisfy the first threshold to suspend the erase pulse stage (e.g., may refrain from suspending the erase operation until the first condition is satisfied). If the timer value does not satisfy the timer condition and the timer value is greater than the second threshold, then the controller 130 may wait for the erase pulse stage to be completed to suspend the erase operation (e.g., and may refrain from suspending the erase operation until the erase pulse stage is completed and the first condition is satisfied). In some cases, the erase pulse stage may have a duration that is greater than a threshold, and the high priority memory command cannot be performed to satisfy a requirement if the high priority memory command is received early in the erase pulse stage. Thus, in some implementations, if the active stage has a duration that is greater than (or equal to) a threshold, then the condition for suspending the erase operation may be that either the active stage is complete or a timer value, associated with the active stage, satisfies a timer condition.

As further shown by reference number 830, and as another example, if the active stage is an erase preparation stage, an erase verify stage, or an erase completion stage, then the condition (e.g., a second condition) for suspending the erase operation may be that the active stage is complete. For example, if the controller 130 detects the pending high priority memory command during the erase preparation stage, the erase verify stage, or the erase completion stage, then the controller 130 may wait for the active stage to be completed to suspend the erase operation (e.g., and may refrain from suspending the erase operation during the active stage). In some cases, the erase preparation stage, the erase verify stage, and the erase completion stage may have a duration that is less than a threshold, and the high priority memory command may be performed to satisfy a requirement even if the high priority memory command is not performed until after the stage is complete. Thus, in some implementations, if the active stage has a duration that is less than (or equal to) a threshold, then the condition for suspending the erase operation may be that the active stage is complete. Thus, the second condition may prevent the erase operation from being suspended until after the erase verify stage, the erase preparation stage, or the erase completion stage is complete. In some implementations, the erase operation is complete after the erase completion stage is performed. Thus, the controller 130 need not suspend the erase operation after the erase completion stage is performed.

Rather, the controller 130 waits until the erase operation is complete, and may then execute the high priority memory command.

As shown by reference number 840, the controller 130 may determine whether the identified condition is satisfied. For example, if the controller 130 identifies the first condition based on the active stage being a first type of stage, then the controller 130 may determine whether the first condition is satisfied. Similarly, if the controller 130 identifies the second condition based on the active stage being a second type of stage, then the controller 130 may determine whether the second condition is satisfied.

As shown by reference number 850, if the identified condition is satisfied, then the controller 130 may suspend the erase operation (e.g., during the active stage or after the active stage is complete, depending on the identified condition), in a similar manner as described elsewhere herein. In some implementations, the controller 130 may store a progress indicator and/or a stage indicator, as described elsewhere herein. If the identified condition is not satisfied, then the controller 130 may monitor the erase operation (e.g., for stage completion and/or a timer value) and may suspend the erase operation when the condition is satisfied.

Although some implementations are described herein in connection with two types of stages (e.g., a first stage type and a second stage type), in some implementations, there may be more than two stage types. For example, the controller 130 may identify a first condition for a first stage type (e.g., an erase pulse stage), may identify a second condition for a second stage type (e.g., an erase verify stage), may identify a third condition for a third stage type (e.g., an erase preparation stage), may identify a fourth condition for a fourth stage type (e.g., an erase completion stage), and so on. In some implementations, different conditions may be associated with different timer thresholds, as described above in connection with FIG. 7.

As indicated above, FIG. 8 is provided as an example. Other examples may differ from what is described with regard to FIG. 8.

FIG. 9 is a diagram of an example 900 of suspending memory erase operations to perform high priority memory commands. The operations described in connection with FIG. 9 may be performed by the memory device 120 and/or one or more components of the memory device 120, such as the controller 130.

As shown by reference number 905, the controller 130 may detect a pending high priority memory command during an erase operation (and/or during an active stage of the erase operation), as described above in connection with reference number 610 of FIG. 6. In the example 900 of FIG. 9, the controller 130 detects a pending high priority memory command during an erase pulse stage of the erase operation. Details of the erase operation and the erase pulse stage are described above in connection with FIG. 4. The controller 130 may selectively suspend the erase pulse stage based on detecting the pending high priority memory command and based on whether the elapsed time satisfies a condition.

For example, as shown by reference number 910, the controller 130 may determine whether an elapsed time, associated with the erase pulse stage, satisfies a condition. In some implementations, the controller 130 may start a suspend determination timer at the beginning of the erase pulse stage, such as at the beginning of a voltage ramping period and/or when the memory device 120 begins to raise the voltage from the baseline voltage to the erase voltage. Thus, a value of the suspend determination timer may represent an amount of time that has elapsed during the erase pulse stage (e.g., since a start of the erase pulse stage). In some implementations, the controller 130 may restart the suspend determination timer at the beginning of each erase pulse stage and/or at the beginning of each new stage of the erase operation (e.g., at the beginning of an erase pulse stage, an erase verify stage, an erase preparation stage, or an erase completion stage).

If the elapsed time does not satisfy the condition, then the controller 130 may refrain from suspending the erase operation (e.g., may refrain from suspending the erase pulse stage), and may wait for the condition to be satisfied (e.g., at a later time). As shown by reference number 915, if the elapsed time satisfies the condition, then the controller 130 may suspend the erase operation (e.g., may suspend the erase pulse stage) and may execute the pending high priority memory command while the erase operation (e.g., the erase pulse stage) is suspended. As described elsewhere herein, the controller 130 may store a progress indicator based on progress of the erase pulse stage prior at a time when the erase pulse stage is suspended, and may use the progress indicator to later resume the erase pulse stage.

As described elsewhere herein, in some implementations, the condition is that the elapsed time is greater than (or equal to) a first threshold 920, shown as tmin in FIG. 9. The first threshold may correspond to a time that is after the voltage ramping period of the erase pulse stage. This may prevent the erase pulse stage from being suspended during a voltage ramping time period of the erase pulse stage. If the erase pulse stage is suspended during the erase pulse stage, then no progress is made in the erase pulse stage because the erase voltage is never applied to selected access lines (e.g., during the erase voltage period) to erase memory cells on those access lines. Thus, some implementations ensure that progress is made during the erase pulse stage for reasons described elsewhere herein. As an example, if a high priority memory command (e.g., a host read command) is received or detected at a time 925 that is during the voltage ramping period, then the controller 130 may refrain from immediately suspending the erase pulse stage because an elapsed time of the erase pulse stage (e.g., measured from a time shown as t1) is less than the first threshold 920.

In some implementations, the first threshold 920 may correspond to a time that is a minimum threshold time after the voltage ramping period (e.g., as also shown by tmin). This may ensure that some minimum amount of progress is made during the erase voltage period (e.g., rather than immediately suspending the erase voltage pulse after the erase voltage is reached, which would not lead to any progress in the erase voltage period). As an example, if a high priority memory command (e.g., a host read command) is received or detected at a time 930 that is after the voltage ramping period but before tmin, then the controller 130 may refrain from immediately suspending the erase pulse stage because an elapsed time of the erase pulse stage (e.g., measured from a time shown as t1) is less than the first threshold 920.

However, in some cases, the controller 130 may not need to ensure that the erase pulse stage is not suspended during the voltage ramping period. For example, the controller 130 may allow the erase pulse stage to be suspended during the voltage ramping period (e.g., without using the first threshold 920) if a maximum suspend limit satisfies a threshold (e.g., is greater than or equal to the threshold). The maximum suspend limit may indicate a quantity of times that the controller 130 is permitted to suspend the erase operation or a particular stage of the erase operation. If the maximum suspend limit is high, then the controller 130 may not need to ensure that progress is made during the erase pulse stage, and thus can allow the erase pulse stage to be suspended during the voltage ramping period. However, if the maximum suspend limit does not satisfy the threshold (e.g., is less than or equal to the threshold), then the controller 130 may use the first threshold 920 to ensure that the erase pulse stage is not suspended during the voltage ramping period.

Additionally, or alternatively, the condition may be that the elapsed time is less than (or equal to) a second threshold 935, shown as tmax in FIG. 9. The second threshold may correspond to a time that is before an end of the erase pulse stage. This may prevent the erase pulse stage from being suspended within a threshold time period before the end of the erase pulse stage (e.g., from tmax to t3 or tmax to t4 in FIG. 9). Suspending the erase pulse stage during a time period that is within a threshold time of the end of the erase pulse stage may be unnecessary to satisfy a requirement associated with the high priority memory command, and thus would waste resources, consume excess power, and lead to longer than necessary erase times. Thus, some implementations reduce waste, reduce excess power consumption, and lead to lower erase times. As an example, if a high priority memory command (e.g., a host read command) is received or detected at a time 940 that is after the second threshold 935 and before the end of the erase pulse stage (which may correspond to either t3 or t4), then the controller 130 may refrain from immediately suspending the erase pulse stage because an elapsed time of the erase pulse stage (e.g., measured from a time shown as t1) is greater than the second threshold 935.

In some implementations, the condition may include both the elapsed time being greater than or equal to the first threshold 920 and less than or equal to the second threshold 935. In this case, second threshold 935 corresponds to a time that is after the first threshold 920 and before the end of the erase pulse stage. Similarly, the first threshold 920 corresponds to a time that is after the voltage ramping period and before the second threshold 935. As an example, if a high priority memory command (e.g., a host read command) is received or detected at a time 945 that is after the first threshold 920 and before the second threshold 935, then the controller 130 may immediately suspend the erase pulse stage because an elapsed time of the erase pulse stage (e.g., measured from a time shown as t1) is greater than the first threshold 920 and less than the second threshold 935.

In some implementations, the controller 130 may store a progress indicator that indicates an amount of time that the erase voltage was applied, during the erase voltage period, prior to the erase pulse stage being suspended. In FIG. 9, the amount of time that the erase voltage was applied is represented by a progress window 950. The controller 130 may determine a duration of the progress window 950 based on a difference between the time 945 at which the erase pulse stage is suspended and a time shown as t2, which represents the end of the voltage ramping period, the beginning of the erase voltage period, and a time at which the erase voltage is initially applied during the erase pulse stage. In some implementations, the controller 130 may store a static value that represents the duration of the voltage ramping period and may subtract this static value from the elapsed time at which the erase pulse stage is suspended to determine the duration of the progress window 950.

However, in some cases, the duration of the voltage ramping period may vary over the lifespan of the memory device 120 (e.g., based on a number of PIE cycles of a block that is being erased). Thus, in some implementations, the static value used by the controller 130 to determine the duration of the progress window 950 may be based on the number of PIE cycles of the block that is being erased (e.g., based on a lookup table or a function). Alternatively, the controller 130 may determine the actual duration of the voltage ramping period, such as by using a voltage ramping timer that is initiated at the start of the voltage ramping period (e.g., at a time t1, which may be the same time that the suspend determination timer is initiated), and that stops when the controller 130 detects that the erase voltage has been reached (e.g., that the voltage ramping period has ended). In this case, the controller 130 may determine the duration of the progress window 950 by determining the difference between the elapsed time at which the erase pulse stage is suspended and the actual duration of the voltage ramping period. This may lead to a more accurate determination of the duration of the progress window 950.

After suspending the erase pulse stage, the controller 130 may execute one or more pending high priority memory commands (e.g., one or more pending host read commands). In some implementations, the quantity of high priority memory commands that are executed while the erase pulse stage is suspended may be based on a threshold, such as a maximum execution count, as described elsewhere herein. As shown by reference number 955, after executing one or more pending high priority memory commands, the controller 130 may resume the erase pulse stage. As shown in FIG. 9, resuming the erase pulse stage may include ramping a voltage on selected access lines from the baseline voltage to the erase voltage during a voltage ramping period and applying the erase voltage during an erase voltage period. However, the duration for which the erase voltage is applied (e.g., the duration of the erase voltage period) is based on the amount of time that the erase voltage was applied prior to the erase pulse stage being suspended.

For example, rather than the erase voltage being applied from t2 to t3 after resumption, which represents a maximum duration (sometimes called a full duration) of the erase voltage period (e.g., when the erase voltage period is not shortened or suspended), the erase voltage is applied from t2 to t3' after resumption, which is less than the maximum duration of the erase voltage period. For example, the controller 130 may shorten the erase voltage period after resumption by a time that is equal to the progress window 950. This shortened time period is represented by a reduction window 960, which has the same duration as the progress window 950.

In some implementations, the controller 130 may determine a shortened duration 965 for applying the erase voltage (e.g., a duration for the erase voltage period) after resumption by subtracting an amount of time represented by the progress window 950 from a maximum duration of the erase voltage period. After the erase voltage is applied for the shortened duration 965 (e.g., as determined based on a timer), the controller 130 may trigger the resumed erase pulse stage to end.

In some cases, the resumed erase pulse stage may also be suspended to allow a high priority memory command to be executed, in a similar manner as described above. In this case, the controller 130 may determine another progress window (e.g., a second progress window), in a similar manner as described above. The controller 130 may determine a cumulative progress window as the sum of all prior progress windows determined for the suspended erase pulse stage, such as a sum of the amounts of time represented by the progress window 950 (e.g., a first progress window), the second progress window, and so on. Upon subsequent resumption of the erase pulse stage, the controller 130 may determine a cumulative shortened duration for the erase voltage period based on the cumulative progress window, such as by subtracting an amount of time represented by the cumulative progress window from a maximum duration of the erase voltage period.

As indicated above, FIG. 9 is provided as an example. Other examples may differ from what is described with regard to FIG. 9.

FIG. 10 is a diagram of an example 1000 of suspending memory erase operations to perform high priority memory commands. The operations described in connection with FIG. 10 may be performed by the memory device 120 and/or one or more components of the memory device 120, such as the controller 130.

As shown in FIG. 10, in some implementations, the controller 130 may use one or more fixed times 1005 to determine whether to suspend the erase pulse stage (or another erase operation stage), shown as first fixed time 1005-1 (tsus1) and a second fixed time 1005-2 (tsus2). In this case, the controller 130 may determine whether to suspend the erase pulse stage based on whether the high priority memory command is received or detected before a fixed time 1005 during the erase pulse stage, such as based on a suspension determination timer value being less than a value of the fixed time 1005. Although FIG. 10 is described in connection with the erase pulse stage, these operations may be applied to other types of erase operation stages.

As an example, if the controller 130 detects a high priority memory command at a time 1010 that is before the first fixed time 1005-1, then the controller 130 may wait until the first fixed time 1005-1 to suspend the erase pulse stage. For example, the controller 130 may allow the erase voltage to continue to be applied until an elapsed time is equal to the first fixed time 1005-1, at which time the controller 130 may suspend the erase pulse stage. As shown by reference number 1015, the controller 130 may later resume the erase pulse stage with a shortened duration of the erase voltage period, in a similar manner as described above in connection with FIG. 9.

As an example, if the controller 130 detects a high priority memory command at a time 1020 that is after the first fixed time 1005-1 and before the second fixed time 1005-2, then the controller 130 may wait until the second fixed time 1005-2 to suspend the erase pulse stage. For example, the controller 130 may allow the erase voltage to continue to be applied until an elapsed time is equal to the second fixed time 1005-2, at which time the controller 130 may suspend the erase pulse stage. As shown by reference number 1025, the controller 130 may later resume the erase pulse stage with a shortened duration of the erase voltage period, in a similar manner as described above in connection with FIG. 9.

In some implementations, the controller 130 may determine which fixed time, of multiple fixed times, at which to suspend the erase pulse stage based on a current suspend count and/or a maximum suspend limit. The current suspend count may indicate a quantity of times that the erase operation or the active stage of the erase operation has been suspended, and the maximum suspend limit may indicate a quantity of times that the controller 130 is permitted to suspend the erase operation or a particular stage (e.g., a particular stage type) of the erase operation (e.g., the active stage). If the current suspend count is less than (or equal to) a threshold (which may depend on the maximum suspend limit), then the controller 130 may suspend the erase pulse stage at the next fixed time that occurs. However, if the current suspend count is greater than (or equal to) the threshold, then the controller 130 may, for example, allow the erase voltage to continue to be applied past the next fixed time that occurs and up to a subsequent fixed time that occurs. This may help ensure that the maximum suspend limit is not exceeded.

By using a small number of fixed times and suspending an active stage of an erase operation at only those fixed times, complexity may be reduced as compared to allowing suspension at any time within a window (e.g., as described above in connection with FIG. 9). For example, in the example 1000 of FIG. 10, the controller 130 does not need to perform any calculations to determine the length of the shortened duration of the erase voltage period because there are a fixed number of possible shortened durations (e.g., two in FIG. 10). Rather, the controller 130 needs to store only an indication of which fixed time the active stage was suspended and an indication of a correspondence between that fixed time and a corresponding shortened duration to be used after resumption. This reduces processing power and conserves computing resources as compared to calculating the shortened duration of the erase voltage period. Although two fixed durations are shown in FIG. 10, a different quantity of fixed durations may be used, such as one, three, four, and so on.

The techniques described in connection with FIG. 10 may be used with other techniques described herein (e.g., in connection with FIGS. 6-9 and 11-13). For example, the fixed times may be used in addition to one or more thresholds, as described above in connection with FIG. 9 and others. Additionally, or alternatively, the fixed times may be used as the conditions described elsewhere herein.

As indicated above, FIG. 10 is provided as an example. Other examples may differ from what is described with regard to FIG. 10.

FIG. 11 is a flowchart of an example method 1100 associated with suspending memory erase operations to perform higher priority memory commands. In some implementations, a memory device (e.g., memory device 120) may perform or may be configured to perform one or more process blocks of FIG. 11. In some implementations, another device or a group of devices separate from or including the memory device (e.g., the system 100) may perform or may be configured to perform one or more process blocks of FIG. 11. Additionally, or alternatively, one or more components of the memory device (e.g., the controller 130, the memory management component 250, the command detection component 260, the suspension control component 270, the suspension component 280 and/or the command execution component 290) may perform or may be configured to perform one or more process blocks of FIG. 11.

As shown in FIG. 11, the method 1100 may include detecting a pending host read command during an erase pulse stage of an erase operation that is being performed by a memory device, wherein the erase pulse stage includes: a voltage ramping period in which a voltage applied to a plurality of access lines of the memory device increases from a baseline voltage to an erase voltage, and an erase voltage period, that follows the voltage ramping period, in which the erase voltage is applied to the plurality of access lines (block 1110). As further shown in FIG. 11, the method 1100 may include determining an elapsed time associated with the erase pulse stage of the erase operation (block 1120). As further shown in FIG. 11, the method 1100 may include selectively suspending the erase pulse stage of the erase operation based on detecting the pending host read command and based on whether the elapsed time satisfies a condition (block 1130).

Although FIG. 11 shows example blocks of a method 1100, in some implementations, the method 1100 may include additional blocks, fewer blocks, different blocks, or differently arranged blocks than those depicted in FIG. 11. Additionally, or alternatively, two or more of the blocks of the method 1100 may be performed in parallel. The method 1100 is an example of one method that may be performed by one or more devices described herein. These one or more devices may perform or may be configured to perform one or more other methods based on operations described herein, such as the operations described in connection with FIGS. 6-9 and/or 12-13.

FIG. 12 is a flowchart of an example method 1200 associated with suspending memory erase operations to perform higher priority memory commands. In some implementations, a memory device (e.g., memory device 120) may perform or may be configured to perform one or more process blocks of FIG. 12. In some implementations, another device or a group of devices separate from or including the memory device (e.g., the system 100) may perform or may be configured to perform one or more process blocks of FIG. 12. Additionally, or alternatively, one or more components of the memory device (e.g., the controller 130, the memory management component 250, the command detection component 260, the suspension control component 270, the suspension component 280 and/or the command execution component 290) may perform or may be configured to perform one or more process blocks of FIG. 12.

As shown in FIG. 12, the method 1200 may include detecting, while an active stage of an erase operation is being performed by a memory device, a pending memory command with a higher priority than the erase operation (block 1210). As further shown in FIG. 12, the method 1200 may include selectively suspending the active stage of the erase operation, to allow the pending memory command to be executed, based on at least one of: the active stage of the erase operation that is being performed, or a value of a suspend determination timer associated with suspending the active stage of the erase operation (block 1220).

Although FIG. 12 shows example blocks of a method 1200, in some implementations, the method 1200 may include additional blocks, fewer blocks, different blocks, or differently arranged blocks than those depicted in FIG. 12. Additionally, or alternatively, two or more of the blocks of the method 1200 may be performed in parallel. The method 1200 is an example of one method that may be performed by one or more devices described herein. These one or more devices may perform or may be configured to perform one or more other methods based on operations described herein, such as the operations described in connection with FIGS. 6-11 and/or 13.

FIG. 13 is a flowchart of an example method 1300 associated with suspending memory erase operations to perform higher priority memory commands. In some implementations, a system (e.g., system 100) may perform or may be configured to perform one or more process blocks of FIG. 13. In some implementations, another device or a group of devices separate from or including the system (e.g., memory device 120) may perform or may be configured to perform one or more process blocks of FIG. 13. Additionally, or alternatively, one or more components of the system (e.g., the controller 130, the memory management component 250, the command detection component 260, the suspension control component 270, the suspension component 280 and/or the command execution component 290) may perform or may be configured to perform one or more process blocks of FIG. 13.

As shown in FIG. 13, the method 1300 may include performing an erase operation on memory, wherein the erase operation includes one or more erase pulse stages and one or more erase verify stages, wherein each erase verify stage follows a corresponding erase pulse stage (block 1310). As further shown in FIG. 13, the method 1300 may include detecting, while the erase operation is being performed, a pending memory command having a higher priority than the erase operation (block 1320). As further shown in FIG. 13, the method 1300 may include suspending the erase operation to enable the pending memory command to be executed, wherein suspending the erase operation comprises: suspending the erase operation based on a first condition if an erase pulse stage of the erase operation is being performed, and suspending the erase operation based on a second condition if an erase verify stage of the erase operation is being performed (block 1330).

Although FIG. 13 shows example blocks of a method 1300, in some implementations, the method 1300 may include additional blocks, fewer blocks, different blocks, or differently arranged blocks than those depicted in FIG. 13. Additionally, or alternatively, two or more of the blocks of the method 1300 may be performed in parallel. The method 1300 is an example of one method that may be performed by one or more devices described herein. These one or more devices may perform or may be configured to perform one or more other methods based on operations described herein, such as the operations described in connection with FIGS. 6-12.

In some implementations, a memory device includes one or more components configured to: detect a pending host read command during an erase pulse stage of an erase operation that is being performed by the memory device, wherein the erase pulse stage includes: a voltage ramping period in which a voltage applied to a plurality of access lines of the memory device increases from a baseline voltage to an erase voltage, and an erase voltage period, that follows the voltage ramping period, in which the erase voltage is applied to the plurality of access lines; determine an elapsed time associated with the erase pulse stage of the erase operation; and selectively suspend the erase pulse stage of the erase operation based on detecting the pending host read command and based on whether the elapsed time satisfies a condition.

In some implementations, a method includes detecting, by a memory device and while an active stage of an erase operation is being performed by the memory device, a pending memory command with a higher priority than the erase operation; and selectively suspending, by the memory device, the active stage of the erase operation, to allow the pending memory command to be executed, based on at least one of: the active stage of the erase operation that is being performed, or a value of a suspend determination timer associated with suspending the active stage of the erase operation.

In some implementations, a system includes means for performing an erase operation on memory, wherein the erase operation includes one or more erase pulse stages and one or more erase verify stages, and wherein each erase verify stage follows a corresponding erase pulse stage; means for detecting, while the erase operation is being performed, a pending memory command having a higher priority than the erase operation; and means for suspending the erase operation to enable the pending memory command to be executed, wherein the means for suspending the erase operation comprises: means for suspending the erase operation based on a first condition if an erase pulse stage of the erase operation is being performed, and means for suspending the erase operation based on a second condition if an erase verify stage of the erase operation is being performed.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, the terms "substantially" and "approximately" mean "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:
   one or more components configured to:
   detect a pending host read command during an erase operation that is being performed by the memory device,
   wherein the erase operation includes an erase pulse stage and an erase verify stage; and
   selectively suspend the erase operation based on detecting the pending host read command and based on:
   a first condition if the erase pulse stage is being performed, and
   a second condition if the erase verify stage is being performed.

2. The memory device of claim 1, wherein selectively suspending the erase pulse stage comprises:
   suspending the erase pulse stage and executing the pending host read command while the erase pulse stage is suspended if an elapsed time satisfies the first condition, and
   refraining from suspending the erase pulse stage if the elapsed time does not satisfy the first condition,
   wherein the one or more components are configured to execute the pending host read command at a later time when the elapsed time satisfies the first condition or after the erase pulse stage is complete if the elapsed time does not satisfy the first condition.

3. The memory device of claim 2, wherein the elapsed time is an amount of time that has elapsed since a start of the erase pulse stage.

4. The memory device of claim 1, wherein the first condition is that an elapsed time is greater than or equal to a first threshold.

5. The memory device of claim 1, wherein the first condition is that an elapsed time is less than or equal to a second threshold.

6. The memory device of claim 1, wherein the first condition is that an elapsed time is greater than or equal to a first threshold and is less than or equal to a second threshold.

7. The memory device of claim 6, wherein the first threshold corresponds to a time that is after a voltage ramping period of the erase pulse stage, and wherein the second threshold corresponds to a time that is before an end of the erase pulse stage.

8. The memory device of claim 1, wherein the one or more components are configured to:
   suspend the erase pulse stage of the erase operation based on an elapsed time satisfying the first condition; and
   execute one or more pending host read commands, including the pending host read command, while the erase pulse stage is suspended.

9. The memory device of claim 8, wherein a quantity of the one or more pending host read commands that are executed while the erase pulse stage is suspended is less than or equal to a threshold stored in memory of the memory device.

10. The memory device of claim 8, wherein the one or more components are further configured to:
    store an indication of an amount of time that an erase voltage was applied, during an erase voltage period, prior to the erase pulse stage being suspended; and
    resume the erase pulse stage after executing the one or more pending host read commands, wherein resuming the erase pulse stage comprises:
    ramping a voltage on a plurality of access lines from a baseline voltage to the erase voltage; and
    applying the erase voltage to the plurality of access lines for a time period that is based on the amount of time that the erase voltage was applied prior to the erase pulse stage being suspended.

11. A method, comprising:
    detecting, by a memory device and while an active stage of an erase operation is being performed by the memory device, a pending memory command with a higher priority than the erase operation; and selectively suspending, by the memory device, the active stage of the erase operation, to allow the pending memory command to be executed, based on the active stage of the erase operation that is being performed, wherein suspending the active stage of the erase operation is based on a first condition if the active stage is an erase pulse stage and is based on a second condition if the active stage is an erase verify stage.

12. The method of claim 11, wherein selectively suspending the active stage of the erase operation comprises suspending the active stage of the erase operation based on the active stage being the erase pulse stage.

13. The method of claim 11, wherein selectively suspending the active stage of the erase operation comprises selectively suspending the active stage of the erase operation based on whether a value of a suspend determination timer satisfies the first condition.

14. The method of claim 13, wherein the first condition includes whether the value of the suspend determination timer is greater than or equal to a first threshold.

15. The method of claim 13, wherein the first condition includes whether the value of the suspend determination timer is less than or equal to a second threshold.

16. The method of claim 11, wherein selectively suspending the active stage of the erase operation comprises:
    suspending the active stage of the erase operation and executing the pending memory command while the active stage of the erase operation is suspended.

17. The method of claim 11, wherein selectively suspending the active stage of the erase operation comprises:
    refraining from suspending the active stage of the erase operation; and
    executing the pending memory command at a later time.

18. The method of claim 11, wherein the first condition is that an elapsed time is greater than or equal to a first threshold and is less than or equal to a second threshold.

19. A system, comprising:
    means for performing an erase operation on memory, wherein the erase operation includes one or more erase pulse stages and one or more erase verify stages, and wherein each erase verify stage follows a corresponding erase pulse stage;
    means for detecting, while the erase operation is being performed, a pending memory command having a higher priority than the erase operation; and
    means for suspending the erase operation to enable the pending memory command to be executed, wherein the means for suspending the erase operation comprises:
        means for suspending the erase operation based on a first condition if an erase pulse stage of the erase operation is being performed, and
        means for suspending the erase operation based on a second condition if an erase verify stage of the erase operation is being performed.

20. The system of claim 19, wherein the means for suspending the erase operation based on the first condition comprises:
    means for suspending the erase operation during the erase pulse stage if the first condition is satisfied, and
    means for refraining from suspending the erase operation during the erase pulse stage if the first condition is not satisfied; and
    wherein the means for suspending the erase operation based on the second condition comprises:
        means for suspending the erase operation if the erase verify stage is completed, and
        means for refraining from suspending the erase operation if the erase verify stage is not completed.

21. The system of claim 19, wherein the first condition prevents the erase operation from being suspended during a voltage ramping time period of the erase pulse stage.

22. The system of claim 19, wherein the first condition prevents the erase operation from being suspended within a threshold time period before an end of the erase pulse stage.

23. The system of claim 19, wherein the second condition prevents the erase operation from being suspended until after the erase verify stage is complete.

24. The system of claim 19, wherein the erase operation further includes an erase preparation stage and an erase completion stage; and
    wherein the system further comprises:
        means for suspending the erase operation, to enable the pending memory command to be executed, after the erase preparation stage is completed if the erase preparation stage is being performed; and
        means for executing the pending memory command after completing the erase operation if the erase completion stage is being performed.

25. The system of claim 19, wherein the means for suspending the erase operation based on the first condition comprises means for suspending the erase operation at a fixed time during the erase pulse stage based on the pending memory command being detected before the fixed time.

* * * * *